US010930806B2

(12) United States Patent
Breen et al.

(10) Patent No.: US 10,930,806 B2
(45) Date of Patent: Feb. 23, 2021

(54) THERMAL MANAGEMENT SYSTEM FOR CONTROLLING THE TEMPERATURE OF A REFLECTIVE SURFACE HAVING A SOLAR CONCENTRATOR ARRAY

(71) Applicant: THE BOEING COMPANY, Chicago, IL (US)

(72) Inventors: Marc Louis Breen, Long Beach, CA (US); Scott B. Singer, Sheman Oaks, CA (US); John W. Behrens, Torrance, CA (US)

(73) Assignee: THE BOEING COMPANY, Chicago, IL (US)

( * ) Notice: Subject to any disclaimer, the term of this patent is extended or adjusted under 35 U.S.C. 154(b) by 108 days.

(21) Appl. No.: 15/369,216

(22) Filed: Dec. 5, 2016

(65) Prior Publication Data

US 2018/0158966 A1 Jun. 7, 2018

(51) Int. Cl.
*H01L 31/024* (2014.01)
*H01L 31/054* (2014.01)
*F24S 30/48* (2018.01)
*F24S 40/52* (2018.01)
*B64G 1/44* (2006.01)
*H02S 40/42* (2014.01)
*H02S 20/30* (2014.01)
(Continued)

(52) U.S. Cl.
CPC ............ *H01L 31/024* (2013.01); *B64G 1/443* (2013.01); *F24S 30/48* (2018.05); *F24S 40/52* (2018.05);
(Continued)

(58) Field of Classification Search
CPC ........ F24S 40/52; F24S 2020/23; F24S 23/30; F24S 23/31; F24S 23/70; F24S 23/71;
(Continued)

(56) References Cited

U.S. PATENT DOCUMENTS 5,531,215 A 7/1996 Schwarz
5,950,618 A 9/1999 Wu et al.
(Continued)

FOREIGN PATENT DOCUMENTS

DE 20 2005 002198 U1 4/2005
FR 2 937 122 A1 4/2010
(Continued)

OTHER PUBLICATIONS

Machine translation of FR2937122.*
Extended European Search Report, Application 17204070.1-1009-1216, dated Apr. 25, 2018.

*Primary Examiner* — Eric R Smith
(74) *Attorney, Agent, or Firm* — Moore Intellectual Property Law, PLLC

(57) ABSTRACT

A thermal management system ("TMS") for controlling the temperature of a selective reflective panel is disclosed. The TMS includes a solar concentrator array, a temperature sensor, and a controller. The solar concentrator array is located within the selective reflective panel and has a plurality of reflectors arranged in reflector groups. The temperature sensor monitors a temperature of the selective reflective panel at a location of the temperature sensor. The controller monitors the local temperature of the selective reflective panel utilizing the temperature sensor and, in response, produces a control signal that is sent to the solar concentrator array. The control signal directs the solar concentrator array to position a selected number of reflectors on the concentrator array into an off-pointing position in response to monitoring the temperature sensor, where the selected number of reflectors is determined to control the local temperature of the selective reflective panel.

20 Claims, 20 Drawing Sheets

(51) Int. Cl.
*H01L 31/0232* (2014.01)
*F24S 23/70* (2018.01)

(52) U.S. Cl.
CPC .... H01L 31/02327 (2013.01); H01L 31/0547 (2014.12); H02S 20/30 (2014.12); H02S 40/42 (2014.12); *F24S 2023/84* (2018.05); *F24S 2023/85* (2018.05); *Y02E 10/47* (2013.01); *Y02E 10/52* (2013.01)

(58) Field of Classification Search
CPC .......... F24S 23/715; F24S 23/72; F24S 23/74; F24S 23/745; F24S 23/75; F24S 23/77; F24S 23/79; F24S 23/80; F24S 23/81; F24S 2023/85; F24S 2023/87; F24S 2023/872–878; F24S 50/00–80; H01L 31/0547; H01L 31/054–0547; H02S 40/22; H02S 20/30; H02S 20/32; H02S 40/10–12; H02S 40/20–22
See application file for complete search history.

(56) References Cited

U.S. PATENT DOCUMENTS

| | | |
|---|---|---|
| 9,813,022 B2 | 11/2017 | Singer et al. |
| 10,164,140 B2 | 12/2018 | Karam et al. |
| 10,236,822 B2 | 3/2019 | Singer et al. |
| 10,250,182 B2 | 4/2019 | Singer et al. |
| 2008/0210293 A1 | 9/2008 | Reid et al. |
| 2009/0229264 A1* | 9/2009 | Gilon ............ F24S 20/20 60/641.8 |
| 2010/0229852 A1 | 9/2010 | Buckley |
| 2011/0108092 A1* | 5/2011 | Le Lievre .......... H01L 31/0547 136/246 |
| 2011/0214712 A1* | 9/2011 | Frazier .................... H02S 30/20 136/248 |
| 2015/0236639 A1* | 8/2015 | Mangeant ............... H02S 20/32 136/246 |
| 2015/0243819 A1 | 8/2015 | Karam et al. |
| 2015/0244310 A1 | 8/2015 | Singer et al. |
| 2015/0244316 A1 | 8/2015 | Singer et al. |
| 2015/0256124 A1* | 9/2015 | Singer .................... H02S 20/32 136/246 |
| 2017/0222597 A1 | 8/2017 | Behrens et al. |

FOREIGN PATENT DOCUMENTS

| | | | |
|---|---|---|---|
| GB | 2 516 888 A | 2/2015 | |
| JP | 6591753 B2 | 10/2019 | |
| WO | WO-2012137149 A2 * | 10/2012 | ............. F24S 40/10 |

* cited by examiner

THERMAL MANAGEMENT SYSTEM FOR CONTROLLING THE TEMPERATURE OF A REFLECTIVE SURFACE HAVING A SOLAR CONCENTRATOR ARRAY

BACKGROUND

1. Field

The disclosed systems and methods relate to solar concentrator arrays and, more particularly, to systems and methods for thermally managing solar concentrator arrays.

2. Related Art

Electric power generation from solar or photovoltaic cells continues to experience significant interest. Solar cells convert light energy, typically from the Sun, into electrical energy. The light intensity on a solar cell may be referred to as the number of Suns, where a 1-Sun concentration corresponds to standard illumination at 1 kW/m2 on Earth.

Currently available concentrator solar power generators employ flat-plate technologies, where photovoltaic cells, referred to as solar cells in solar power conversion applications, are positioned on a two-dimensional array a distance from groups of reflectors, or concentrators. Sunlight reflects off the reflectors and is directed to the solar cells, which convert the light energy to electrical energy. The voltage at each solar cell is collected at a concentrator array voltage output and delivered to a load. The amount of electrical power output from the concentrator array is determined by the efficiency of the solar cells used, and the area and density of the concentrator array. The concentrator arrays may be provided in units having a set number of solar cells and reflector groups and positioned along a plane to form an even larger panel to further increase the power available from a solar array. Large solar cell panels are generally referred to as solar wings.

More recently developed solar arrays include reflectors available as Micro-Electro-Mechanical Systems ("MEMS") reflectors where the MEMS reflectors include miniaturized mirrors and control components. A single group of MEMs reflectors, which are configured to direct light to a corresponding solar cell, may be implemented as a module. The solar cells and the miniaturized MEMS reflectors, or micro-concentrators, may be configured on the concentrator arrays, or micro-concentrator arrays ("MCM") in higher densities than the solar cells and reflectors in typical solar arrays.

Currently, solar cells and reflectors are being used in a variety of applications. An example application is utilizing solar cells as an electrical power supply on spacecraft. Other applications include terrestrial solar power supplies.

A problem with utilizing solar cells on a spacecraft is that the solar cell panels may overheat when they are exposed to too much Sunlight. Typically, this is not an issue with satellites that have predictable positions relative to the Sun and, therefore, may be designed to limit the thermal effects of the Sunlight along the orbit of the Satellite. However, non-satellite spacecraft such as for example, probes or other interplanetary spacecraft have trajectories and sensors that create dynamic environments that result in the possibility of overheating the solar cell panels that may result in damage to the solar cell panels.

Unfortunately, at present there are no currently known approaches to manage a dynamically changing and highly variable thermal environment experienced by a non-orbital spacecraft traveling through outer space. On these spacecraft, the temperature varies across the total area of the solar wing of the spacecraft, where the variance is based on factors that include the distance from the Sun of the spacecraft and the angle to the Sun of the solar wing. Additionally, the structural composition and position of components within the solar wing also creates different temperature zones within the solar wing. Furthermore, other external structures (e.g., reflections from radiators, antennas, or other protrusions on the spacecraft) around the solar wing may create shadows or over-illumination on the solar wing, which also contributes to the complexity of the thermal control challenge.

A common solution is to depopulate these areas on the solar wing and/or to cover the area with a white thermal control coating or optical mirrors. Examples of these approaches may include utilizing passive thermal control mirrors (e.g., Magellan Venus Radar Mapper probe), thermal blankets, radiators, and ceramic cloth sunshades. A problem with these approaches is that they result in reducing the power to mass ratio of the solar wing and they are fixed solutions that are not dynamic. As such, these fixed solutions may not be fully effective and can decrease mission life.

There is a need in the art for systems and methods for thermally managing solar panels that address at least some of the above issues as well as any other possible issues.

SUMMARY

Disclosed is a thermal management system ("TMS") for controlling the temperature of a selectively reflective panel. The selectively reflective panel may be a mirror or solar panel and may be located on a spacecraft. The TMS may include a solar concentrator array, a temperature sensor, and a controller. The solar concentrator array is located within the selectively reflective panel and has a plurality of reflectors arranged in reflector groups. The temperature sensor is configured to monitor a temperature of the selectively reflective panel at a location of the temperature sensor (i.e., a local temperature of the selectively reflective panel). The controller is in signal communication with both the temperature sensor and the solar concentrator array. The controller is configured to monitor the local temperature of the selectively reflective panel utilizing the temperature sensor and, in response, produce a control signal that is sent to the solar concentrator array. The control signal directs the solar concentrator array to position a selected number of reflectors on the concentrator array into an off-pointing position in response to monitoring the temperature sensor, where the selected number of reflectors is determined to control the local temperature of the selectively reflective panel. In this example, the positioning the selected number of reflectors into the off-pointing position includes positioning the selected number of reflectors into a partial off-pointing position or a full off-pointing position, where there may be numerous partial off-pointing positions. The solar concentrator array is configured to receive the control signal and, in response, position the selected number of reflectors into the off-pointing position to control the local temperature of the selectively reflective panel thereby controlling the temperature of the solar panel.

In this example, the controller may include a processor and a non-transitory computer-readable storage medium storing executable instructions that, when executed by the processor, are operative to monitor the local temperature of the selectively reflective panel with the temperature sensor and produce the signal to position the selected number of reflectors on the concentrator array into the off-pointing position in response to monitoring the temperature sensor.

As such, in operation, the TMS performs a method that includes: monitoring the temperature of the selectively reflective panel with the temperature sensor; producing, at the controller, the control signal to position a selected number of reflectors on the concentrator array into an off-pointing position in response to the received signal that corresponds to the monitored local temperature, where the selected number of reflectors is determined to control the local temperature of the selectively reflective panel; and receiving the control signal at the solar concentrator array and, in response, positioning the selected number of reflectors into the off-pointing position to control the local temperature of the selectively reflective panel thereby controlling the temperature of the solar panel.

Other devices, apparatus, systems, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE FIGURES

The disclosure may be better understood by referring to the following figures. The components in the figures are not necessarily to scale, emphasis instead being placed upon illustrating the principles of the disclosure. In the figures, like reference numerals designate corresponding parts throughout the different views.

DETAILED DESCRIPTION

Figure 1:
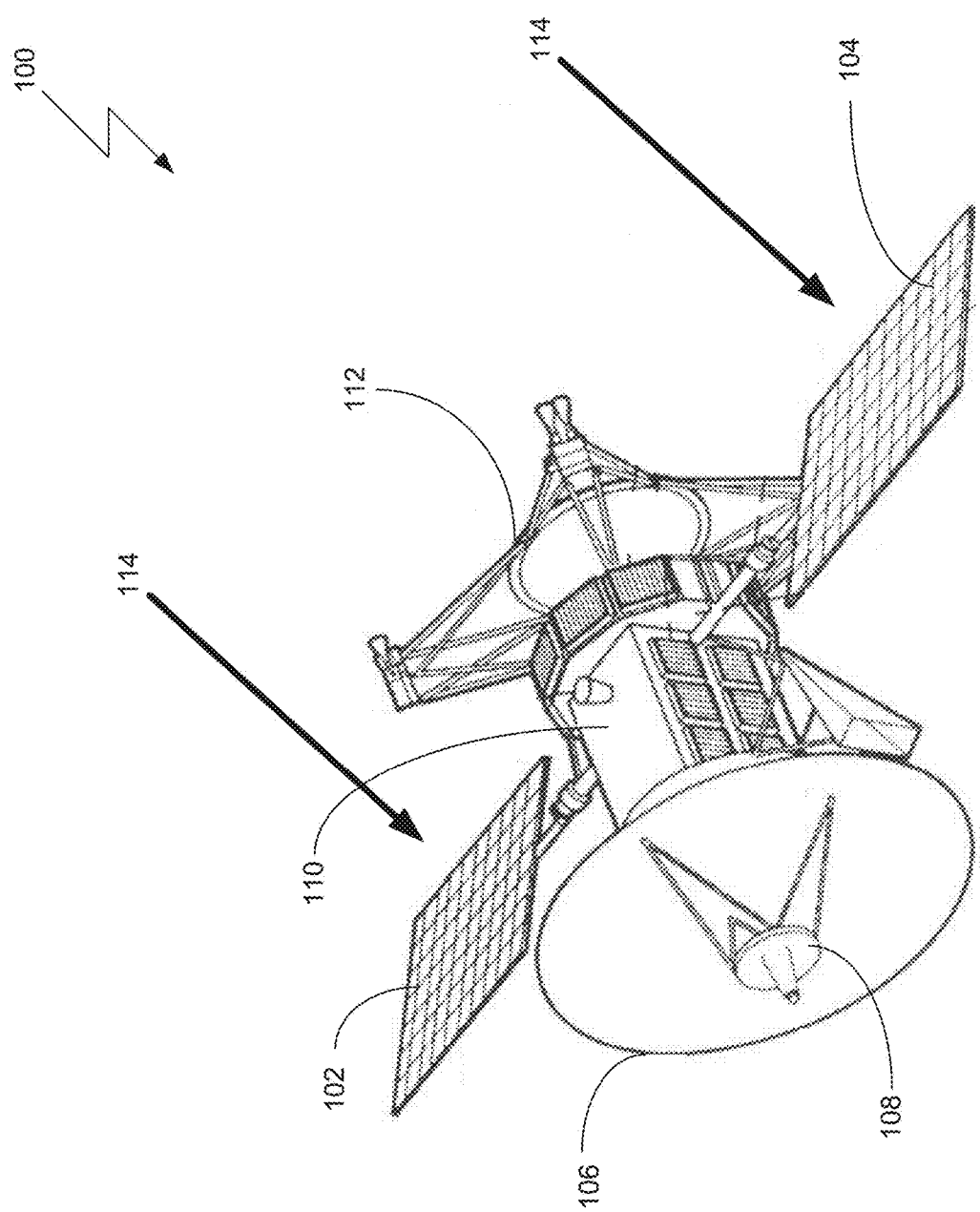
FIG. 1 is a perspective view of an example of an implementation of a spacecraft in accordance with the present disclosure.

Disclosed is a thermal management system ("TMS") for controlling the temperature of a selectively reflective panel. The selectively reflective panel may be a mirror or solar panel and may be located on a spacecraft. The TMS may include a solar concentrator array, a temperature sensor, and a controller. The solar concentrator array is located within the selectively reflective panel and has a plurality reflectors arranged in reflector groups. The temperature sensor is configured to monitor a temperature of the selectively reflective panel at a location of the temperature sensor (i.e., a local temperature of the selectively reflective panel). The controller is in signal communication with both the temperature sensor and the solar concentrator array. The controller is configured to monitor the local temperature of the selectively reflective panel utilizing the temperature sensor and, in response, produce a control signal that is sent to the solar concentrator array. The control signal directs the solar concentrator array to position a selected number of reflectors on the concentrator array into an off-pointing position in response to monitoring the temperature sensor, where the selected number of reflectors is determined to control the local temperature of the selectively reflective panel. In this example, the positioning the selected number of reflectors into the off-pointing position includes positioning the selected number of reflectors into a partial off-pointing position or a full off-pointing position, where there may be numerous partial off-pointing positions. The solar concentrator array is configured to receive the control signal and, in response, position the selected number of reflectors into the off-pointing position to control the local temperature of the selectively reflective panel thereby controlling the temperature of the solar panel. As discussed earlier, the selectively reflective panel may be a mirror or solar panel. If the selectively reflective panel is a solar panel, the solar concentrator array includes a plurality of photovoltaic cells and the plurality of reflectors are arranged in reflector groups corresponding to the plurality of photovoltaic cells.

In this example, the controller may include a processor and a non-transitory computer-readable storage medium storing executable instructions that, when executed by the processor, are operative to monitor the local temperature of the selectively reflective panel with the temperature sensor and produce the control signal to position the selected number of reflectors on the solar concentrator array into the off-pointing position in response to monitoring the temperature sensor.

As such, in operation, the TMS performs a method that includes: monitoring the temperature of the selectively reflective panel with the temperature sensor; producing, at the controller, the control signal to position a selected number of reflectors on the concentrator array into an off-pointing position in response to the received signal that corresponds to the monitored local temperature, where the selected number of reflectors is determined to control the local temperature of the selectively reflective panel; and receiving the control signal at the solar concentrator array and, in response, positioning the selected number of reflectors into the off-pointing position to control the local temperature of the selectively reflective panel thereby controlling the temperature of the selectively reflective panel.

In FIG. 1, a perspective view of an example of an implementation of a spacecraft 100 is shown. The spacecraft 100 may be space probe that includes a pair of solar panels 102 and 104, a high-gain antenna 106, low-gain antenna 108, spacecraft main body 110, and navigation system 112. In this example, each solar panels 102 and 104 shown is an example of an implementation of a selectively reflective panel. Moreover, the spacecraft 100 includes a thermal management system ("TMS") (not shown) for controlling the temperature of the solar panels 102 and 104. The solar panels 102 and 104 are configured to receive sunlight 114 that is radiated from the Sun (not shown).

In this example, the solar panels 102 and 104 may include a plurality of solar concentrator arrays (not shown) and temperature sensors (not shown). The solar concentrator arrays are located within the solar panels 102 and 104 and the temperature sensors may be located within or in contact with the solar panels 102 and 104. One or more controllers (not shown) may be located within the spacecraft main body 110, within the solar panels 102 and 104, in other locations on the spacecraft 100 associated with the solar panels 102 and 104, or combination of these locations.

The controller (or controllers) may be any processor based module, device, or system capable of receiving temperature data from the plurality of temperature sensors and, in response, produce a plurality of control signals (not shown) that are sent to the solar concentrator arrays. The controller may be part of a flight control computer for the spacecraft 100. The control signals are sent to the plurality of solar concentrator arrays and direct the solar concentrator arrays to each position a selected number of reflectors on the corresponding concentrator array into an off-pointing position in response to monitoring the local temperature of the solar panel 102 or 104 at a position on the solar panel that corresponds to the temperature sensor that corresponds to that solar concentrator array. In this example, the controller determines the selected number of reflectors on the corresponding solar concentrator array to control the local temperature of the solar panel 102 or 104 at the position of the solar concentrator array on the solar panel 102 or 104. In this example, the positioning the selected number of reflectors into the off-pointing position includes positioning the selected number of reflectors into a partial off-pointing position or a full off-pointing position, where there may be numerous partial off-pointing positions. It is appreciated by those of ordinary skill in the art that the phrase "off-pointing position" means to direct away from the solar concentrator arrays and/or spacecraft 100.

The TMS includes the one or more temperature sensors on the solar panels 102 or 104, the controller (or controllers), and one or more solar concentrator arrays, where the controller is in signal communication with both the one or more temperature sensors and the one or more solar concentrator arrays. As discussed earlier, each solar concentrator array is configured to receive a control signal from the controller and, in response, position the selected number of reflectors into the off-pointing position to control the local temperature of the solar panel 102 or 104 thereby controlling the temperature of the solar panel 102 or 104.

Figure 2A:
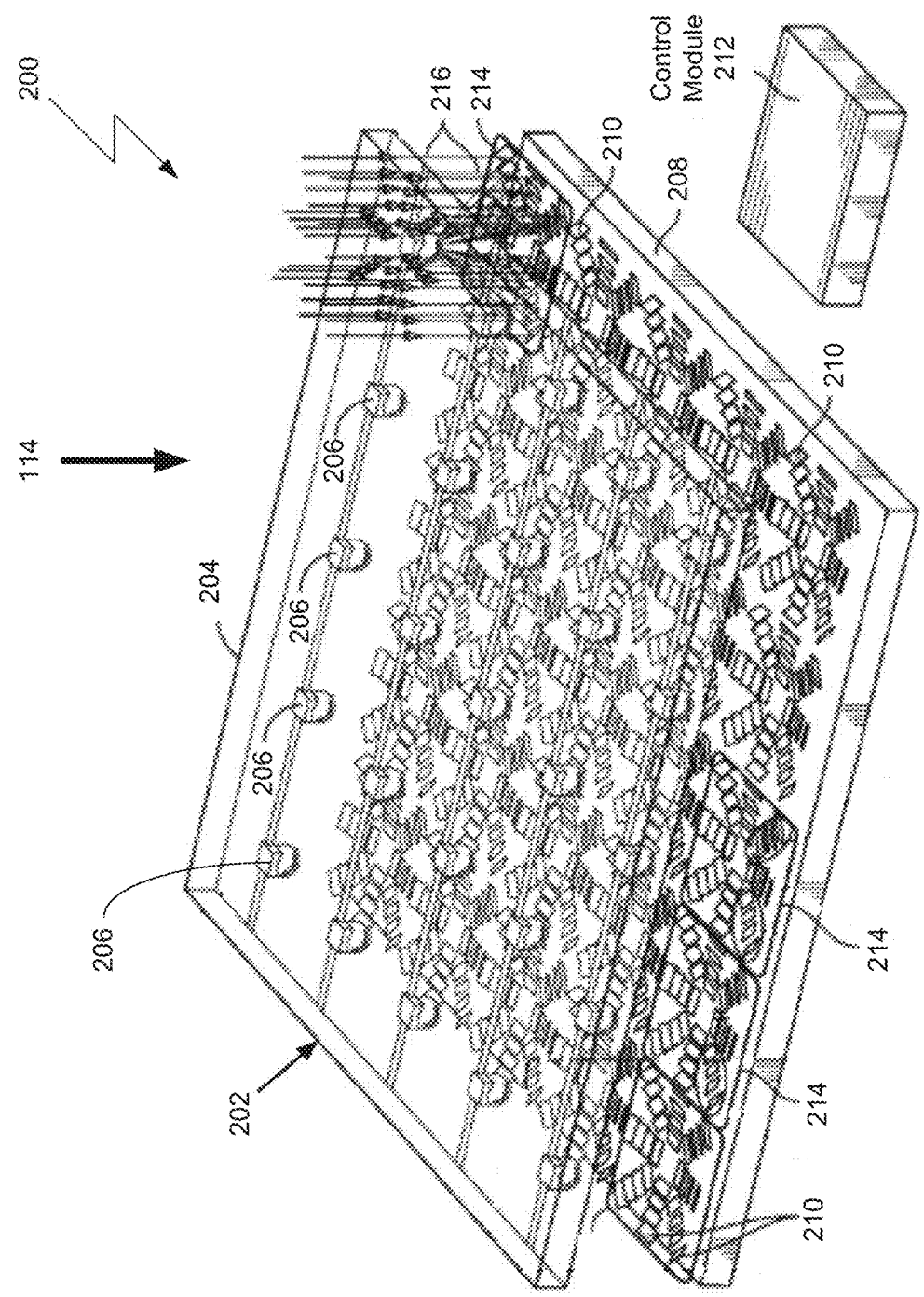
FIG. 2A is a perspective view of an example of a solar concentrator array in accordance with the present disclosure.

Turning to FIG. 2A, a perspective transparent view of an example of an implementation of a solar concentrator module 200 for generating electrical power from received sunlight 114 is shown. The solar concentrator module 200 is located within one of the solar panels 102 or 104 of the spacecraft 100 and includes a solar concentrator array 202. The solar concentrator array 202 includes a cover-glass 204, an optional plurality of photovoltaic cells 206, a substrate 208, and a plurality of reflectors, or concentrators 210. The solar concentrator module 200 also includes a control module 212. In this example, the term "reflectors" and "concentrators" may be utilized interchangeably in that they both describe the same type of devices but in general, the term "concentrators" will be utilized in relation to solar concentrator modules or arrays that include photovoltaic cells (i.e., solar cells) for producing power, while the term "reflectors" may be utilized for both solar concentrator modules or arrays that do not have photovoltaic cells and solar concentrator modules or arrays that do.

In general, the solar concentrator module 200 may be utilized to generate electrical power from the sunlight 114 when the thermal temperature of the solar concentrator module 200 is within an acceptable operating range that is predetermined by the design of the solar panels 102 and 104. The acceptable operating range may be the predetermined thermal temperature range that allows the solar concentrator module 200 and/or solar panel 102 or 104 to operate without causing damage to either solar concentrator module 200 and/or solar panel 102 or 104. If, alternatively, the solar concentrator module 200 does not include any photovoltaic cells, the solar concentrator module 200 may be utilized exclusively to manage the thermal temperature produced by the sunlight 114 to help maintain the thermal temperature of the solar concentrator module 200 is within an acceptable operating range that is predetermined by the design of the concentrator module 200 and the associated structure to which the concentrator module 200 is part of which optionally may not be a solar panel.

In the case of the solar concentrator module having a plurality of photovoltaic cells, in this example, the photovoltaic cells 206 may be arranged in a 5×5 array on the cover-glass 204, which results in a total of twenty-five photovoltaic cells 206 included within the solar concentrator array 202. However, those of ordinary skill in the art will appreciate that the solar concentrator array 202 may include any number of photovoltaic cells 206. The reflectors 210 may be arranged in reflector groups 214 each associated with a corresponding photovoltaic cell 206. Each reflector 210 included within the reflector group 214 may be positioned relative to the associated photovoltaic cell 206 in order to focus or reflect a plurality of light beams 216 generated by the sunlight 114 that is illuminated onto the photovoltaic cell 206.

In general, the solar concentrator module 200 may operate with any type of light source that may be any type of radiating energy source such as, for example, man-made lighting in a building, a laser, or sunlight 114 from the Sun. However, in this example, since we are describing the solar concentrator module 200 being in a solar panel 102 or 104 of a spacecraft 100, the light source is sunlight 114. After reading this disclosure, it will be appreciated by those of ordinary skill in the art that the solar concentrator module 200 may be utilized in non-spacecraft applications.

Turning to the plurality of reflectors 210 of the in the reflector groups 214, each reflector 210 may be selectively tiltable such that if the position of the sunlight 114 changes, each reflector 210 located within the associated reflector group 214 may be tilted accordingly in order to track the changed position of the Sun and corresponding sunlight 114 relative to the associated photovoltaic cell 206. A reflector oriented to direct sunlight 114 towards the photovoltaic cell is in a photovoltaic cell energizing position. The photovoltaic cell energizing position may change and be continuously updated. For example, since the sunlight 114 is radiated by the Sun, then each reflector 210 located within the associated reflector group 214 may be tilted accordingly in order to track the changing position of the Sun throughout the day. Similarly, a reflector oriented to direct sunlight 114 away from the photovoltaic cell is in a photovoltaic cell non-energizing position.

Again, the solar concentrator module 200 may be utilized in any application where light energy may be converted into electrical energy. However, as stated earlier, since the solar concentrator module 200 in this disclosure is described as being part of a solar panel 102 or 104 of a spacecraft 100, the examples of implementations described herein relate primarily to the use of solar concentrator module in solar power conversion and thermal control applications. FIG. 1A illustrates a single concentrator module 200 that may be used in relatively compact applications such as, for example, a slim-line pocket-sized portable power generator. However, the single concentrator module 200 may be electrically connected or ganged with other concentrator modules in order to create a two-dimensional or tiled array of multiple concentrator modules (not illustrated) used in larger-scale solar power generators. Such solar power generators may be used in applications such as, for example, a terrestrial portable power generator, an unmanned aerial vehicle ("UAV"), satellite, or a non-orbiting spacecraft 100.

The cover-glass 204 may be constructed of any transparent material that allows for the light beams 216 to pass through such as, for example, glass, plastic, or silicon dioxide. The substrate 208 may be used to support or mount the reflectors 210. In one non-limiting example, the substrate 208 may be constructed of fused silica.

The control module 212 provides control and telemetry functions for the concentrator module 200. The control module 212 may include processing resources such as a processor (e.g., a control module processor 242) and storage capabilities (e.g., control module memory 244) to store data and instructions for performing programmed functions. The control module 212 includes functions for controlling the position and orientation of the reflectors 210 as described in more detail below. In examples of different implementations, the control module 212 may control a number of reflectors 210 or of reflector groups 214 to direct light to their corresponding photovoltaic cells 206 where the number of reflector groups 214 so controlled is a concentration ratio of the total number of reflector groups 214 on the solar concentrator array 202. The control module 212 may also include a communications interface for receiving signals or commands from, for example, other computing components such as, for example, a flight computer on a spacecraft. In this example, the control module 212 may be the controller of the TMS or a device, module, or system that is in signal communication with the controller (or controllers) of the TMS.

In the examples of the different implementations described below with reference to FIGS. 2B though 8, examples of the solar concentrator module 200 are described in the context of solar power supplies, and more particularly of solar power supplies for use in the spacecraft 100. It is to be understood that the disclosure is not limited to any particular application or use, or to the precise forms of apparatus or methods. In addition, the description of the solar concentrator arrays below refers to the photovoltaic cells as solar cells. It is to be understood that the terms "photovoltaic cell" and "solar cell" may be used interchangeably.

Figure 2B:
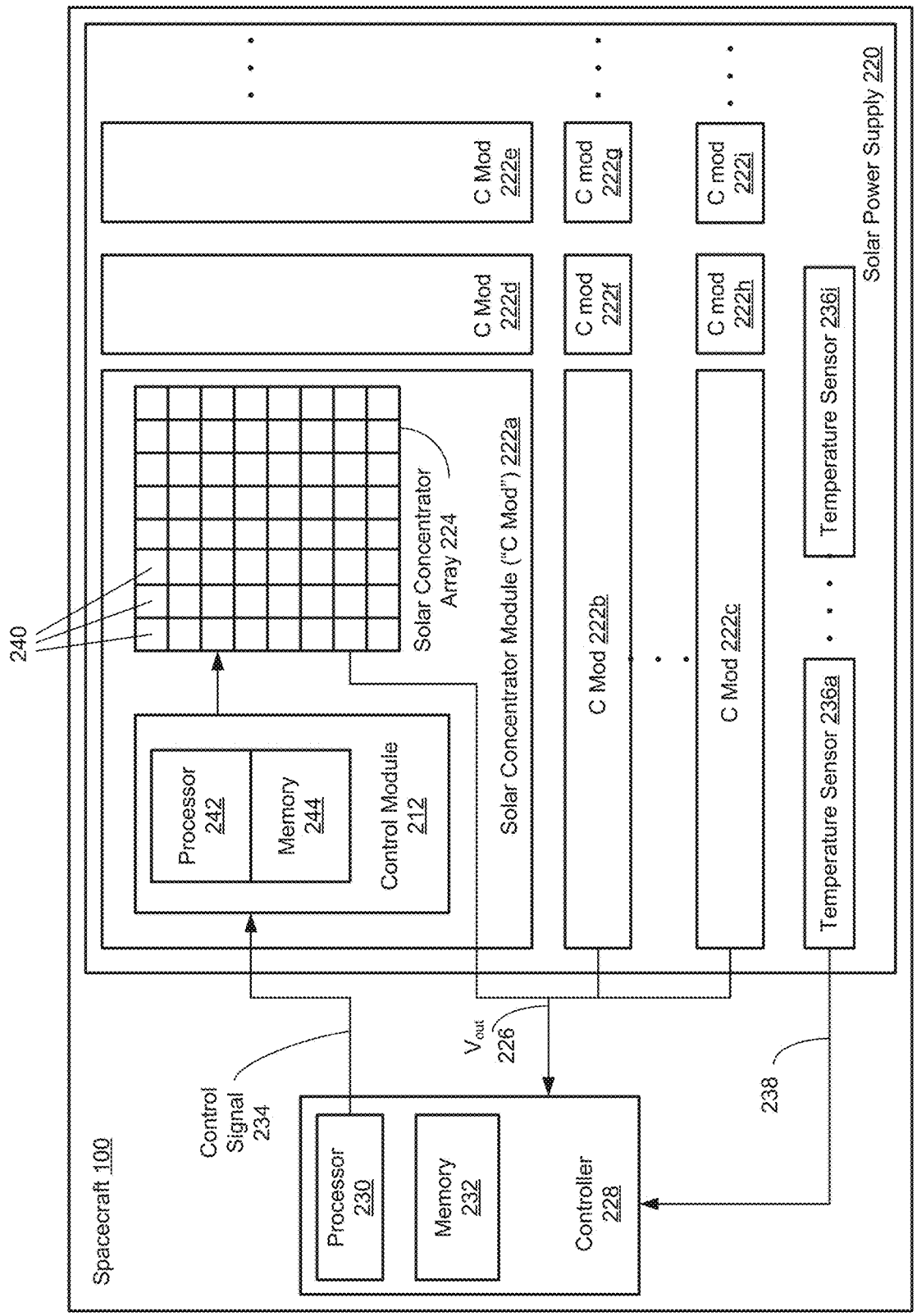
FIG. 2B is a schematic diagram of an example of a solar power supply for providing electrical power to a spacecraft in accordance with the present disclosure.

Turning to FIG. 2B, a schematic diagram of an example of a solar power supply 220 for providing electrical power to the spacecraft 100 is shown in accordance with the present disclosure. In this example, the solar power supply 220 is an equivalent power supply shown for simplicity that includes all the power generating components (i.e., the plurality of solar concentrator modules) of either the first solar panel 102 or the second solar panel 104. It is appreciated by those of ordinary skill in the art that (in this example) the spacecraft 100 will include another solar power supply (not shown) corresponding to the other solar panel 102 or 104. However, for the purposes of simplicity of illustration only one solar power supply 220 is shown corresponding to a single solar panel 102 or 104, where the solar panel 102 or 104 may be referred to as a solar wing.

In this example, the solar power supply 220 is shown having a plurality of solar concentrator modules ("C mod") 222a through 222i, where each solar concentrator modules 222a through 222i generates a power output from a solar concentrator array 224 in each solar concentrator modules 222a through 222i. The power outputs of each solar concentrator module 222a through 222i are connected together to provide a concentrator array power output $V_{out}$ 226, which is utilized to provide electrical power to the spacecraft 100. Again it is appreciated that only one solar power supply 220 is being shown for the simplicity of illustration, as such a second solar power supply (not shown) may also be present with a second concentrator array power output from the second solar power supply that may be combined with $V_{out}$ 226 to power the spacecraft 100.

The spacecraft 100 also includes a controller 228 that is in signal communication with the solar power supply 220 and is configured to receive the $V_{out}$ 226 from the solar power supply 220. The controller 228 may be the controller of the TMS or a device, module, or system that is in signal communication with the controller (or controllers) of the TMS.

The controller 228 is in signal communication with the concentrator array power output (at $V_{out}$ 226) and is configured to distribute the electrical power from the solar power supply 220 to the various loads (not shown) in the spacecraft 100. The controller 228 may also collect data from the solar power supply 220 and from the spacecraft 100 and use the collected data to control the solar power supply 220. The controller 228 may include a processor 230 and memory resources 232 to execute functions relating to control of the solar power supply 220. For example, the memory resources 232 may include a non-transitory computer-readable medium for storing executable instructions that, when executed by the processor 230, are operative to perform the functions described herein. Such functions include steps of determining a concentration ratio, and of signaling the solar concentrator modules 222a through 222i to position reflectors 210 in a solar cell energizing position according to the concentration ratio via a control signal 234.

In this example, the controller 228 is the controller of the TMS and is also in signal communication with a plurality of temperature sensors 236a through 236i that are located either within or along the solar panel 102 or 104 that corresponds to the solar power supply 220. Further in this example, each temperature sensor 236a through 236i is located next to each solar concentration module 222a through 222i so as to sense the "local" temperature of the solar panel (either 102 or 104) close to the corresponding solar concentration module 222a through 222i. As such, the controller 228 is also configured to monitor the local temperature of the solar panel 102 or 104 utilizing the temperature sensors 236a through 236i and, in response, produce another control signal 234 that is sent to the solar concentrator arrays of the solar power supply 220 on the solar panel 102 or 104. The controller 228 monitors the local temperatures by receiving local temperature values from each of the temperature sensors 234a through 234i via temperature signals 238.

When monitoring the local temperature values from each of the temperature sensors 234a through 234i, the controller 228 produces a control signal 234 that directs one or more solar concentrator arrays (such as, for example, 224) in the solar power supply 220 to position a selected number of reflectors 210 on the concentrator array into an off-pointing position in response to monitoring the temperature sensors 234a through 234i, where the selected number of reflectors is determined to control the local temperature of the solar panel 102 or 104. In this example, the positioning the selected number of reflectors 210 into the off-pointing position includes positioning the selected number of reflectors 210 into a partial off-pointing position or a full off-pointing position, where there may be numerous partial off-pointing positions. The solar concentrator array (such as, for example, 224) is configured to receive the control signal 234 and, in response, position the selected number of reflectors 210 into the off-pointing position to control the local temperature of the solar panel (102 or 104) thereby controlling the temperature of the solar panel (102 or 104) corresponding to the solar power supply 220.

In this example of thermal management operation, the controller 228 may include a memory resources 232 that include a non-transitory computer-readable storage medium storing executable instructions that, when executed by the processor 230, are operative to monitor the local temperature of the solar panel 102 or 104 with the temperature sensors 236a through 236i and produce the control signal 234 to position the selected number of reflectors 210 on the solar concentrator array (such as, for example, 224) into the off-pointing position in response to monitoring the temperature sensors 236a through 236i. These and other functions are described in more detail below.

In another example of an implementation, the controller 228 may communicate with a spacecraft 100 flight computer (not shown) for processing and memory resources. In this example, the flight computer may use telemetry signals provided by the controller 228 to signal, or send commands to, the solar concentrator modules 222a through 222i to control the total power output of the solar power supply 220. The flight computer may also provide signaling and commands to the solar concentrator modules 222a through 222i.

It is noted that the processor 230 and memory 232 used in performing electrical power and thermal control functions are described herein as being components of the controller 228. This description is not intended to limit the processing resources for performing the described electrical power or thermal control functions to processing resources in the controller 228. As noted above, the spacecraft 100 may include a flight computer, which may be used to perform some or all of the control functions described herein. It is also noted that the controller 228 may operate as an independent hardware component comprising its own processing resources and software components, or as a functional component operably connected or integrated within a spacecraft 100 flight computer or other processing device, module, or system.

As described earlier, the plurality of solar concentrator modules 222a through 222i may be structurally integrated to form the solar wing, or solar panel 102 or 104, of the solar power supply 220. The plurality of solar concentrator modules 222a through 222i have connected power outputs at the solar concentrator array power that are in signal communication with the output $V_{out}$ 226, which is the total power output of all of the concentrator modules 222a through 222i in the solar power supply 220, that in this example, corresponds to one of the solar panels 102 or 104. Again each solar concentrator module 222a through 222i includes a control module 212 and the solar concentrator array (such as, for example, 224) as shown in the solar concentrator module 222a of FIG. 2B.

Additionally, each solar concentrator module 222a through 222i is configured as described above with reference to FIG. 2A. As an example, the solar concentrator array 224 includes a plurality of solar cell and reflector group units 240 depicted in FIG. 2B as squares in the solar concentrator array 224. The control module 212 in each solar concentrator module 222a through 222i may include the control module processor 242, which may be implemented as an ASIC ("Application Specific Integrated Circuit") or a FPGA ("Field Programmable Gate Array"). The control module 212 may also include the control module memory 244, which includes may include a non-transitory computer-readable medium storing executable instructions that, when executed by the control module processor 242, are operative to perform the functions of the solar concentrator module 222a through 222i. Such functions may include for example, controlling a selected number of reflectors 210 in the solar cell energizing position according to a concentration ratio or positioning the select number of reflectors 210 into an off-pointing position. The control module 212 may include a control interface to the solar cell and reflector group units 240 through which control of the reflectors 210 in the reflector group is performed.

The power output of the solar power supply 220 may be advantageously controlled to generate a desired power output level between a minimum needed to power the spacecraft 100 and a maximum available power output according to a concentration ratio. Additionally, the local temperature of the solar panel 102 or 104 may be thermally controlled by controlling the positioning the reflectors 210 in the reflector groups by placing the reflectors 201 in varying off-pointing positions that reflect off the impinging sunlight 114 in directions away from the solar panel 102 or 104 that prevent the solar concentrator modules 222a through 222i from absorbing the energy from the impinging sunlight 114 and resultantly heat the solar concentrator modules 222a through 222i, which correspondingly heat the solar panel 102 or 104 at the positions of the corresponding solar concentrator modules 222a through 222i (i.e., producing the local temperature values on the solar panel 102 or 104).

The concentration ratio may be determined at any given time by determining an available power output and a spacecraft power requirement and adjusting the concentration ratio to ensure the concentrator array power output is not excessive, but sufficient to meet the spacecraft 100 power requirement as illustrated in the description below with reference to FIGS. 6 and 7.

In another example, the concentration ratio may be provided to the control module 212 as a set-point concentration ratio received from a ground control over a ground control communication. Ground control may track the position of the spacecraft 100 during the mission and determine when the intensity of sunlight 114 from the Sun is affected by the distance of the spacecraft 100 to the Sun to such an extent that the power generated by the solar power supply 220 is either insufficient or excessive (depending on the direction of the spacecraft 100 relative to the Sun). Ground control determines a set-point concentration ratio based on the distance of the spacecraft 100 to the Sun and communicates the set-point concentration ratio to the spacecraft. If the spacecraft 100 is capable of tracking the position of the spacecraft 100 relative to the Sun during the mission, the spacecraft 100 may determine a set-point concentration ratio based on the position of the spacecraft 100 relative to the Sun.

The concentration ratio may be defined in terms of a ratio of the total number of reflectors or solar concentrators used to energize the solar cells. Individual reflectors, or solar concentrators, may be placed in a solar cell energizing position to direct sunlight 114 to the solar cell, or in a solar cell non-energizing position to direct sunlight 114 away from the solar cell. When a solar cell is energized, the solar cell generates electrical energy depending on the sunlight 114 intensity of the sunlight 114 received by the solar cell. A concentration ratio of the total number of reflectors in the solar cell energizing position may result in all of the solar cells being energized, but only by a number of reflectors less than the total number of reflectors resulting in a power output less than the maximum power output capacity of the solar concentrator array (such as, for example, 240).

Additionally, in this example, the ground control may determine that the temperature levels along the solar panels 102 and 104 is becoming too high and, in response, send control signals to the controller 228, control modules (such as, for example, 212), or both that selects a number of reflectors in the solar concentration modules 222a through 222i to be placed in varying off-pointing positions that reflect off the impinging sunlight 114 in directions away from the first solar panel 102, second solar panel 104, or both, to prevent the solar panels 102 or 104 for overheating.

In another example, the concentration ratio may be defined as a number of solar cells or corresponding reflector groups less than the total number on the solar power supply 220 in which all of the reflectors in those reflector groups are in the solar cell energizing position. All of the reflectors in the remaining reflector groups would be in the solar cell non-energizing position. In another example, the concentration ratio may be defined as a number of the concentrator arrays (such as, for example, 240) (assuming all concentrator modules 222a through 222i include solar concentrator arrays with the same number of solar cells) less than the total number of solar concentrator arrays in the solar power supply 220.

In yet another example, the concentration ratio may be defined in terms of area. The solar power supply 220 may include uniformly distributed solar concentrator modules 222a through 222i each having uniformly distributed solar cells and reflector groups 240 so that the solar cells are uniformly distributed on the solar power supply 220 and correspondingly on the solar panel 102 or 104. Given such uniform distribution, the concentration ratio may also be defined as a portion of the total area of the panel forming the solar power supply 220. For example, the solar concentrator array 224 may have an area of 30 sq. in. with 30 one square inch solar cells. Each solar cell would provide $1/30^{th}$ of the total power capacity when energized. A concentration ratio of ½ may refer to half the 30 square inch concentrator array 224 so that the 15 solar cells encompassed by half of the area of the concentrator array 224 would be energized and the other 15 solar cells would not.

As an example, the solar power supply 220 may generate a maximum power capacity of 25 kW with a total of 100 solar cells for a spacecraft 100 that requires 1 kW of power to operate. The concentration ratio may be designated in terms of power output so that a 25:1 concentration ratio corresponds to all reflectors oriented in the solar cell energizing position. The concentration ratio would be set to an initial concentration ratio of 1/25 of the power capacity when the spacecraft 100 is operating at or near Earth. Given this initial concentration ratio, the spacecraft 100 would control the solar power supply to put 1/25 of the total number of reflectors in the solar cell energizing position to generate the 1 kW of electrical power.

The concentration ratio is modified during the mission to ensure the solar power supply 220 generates the required, yet not excessive, power output. For example, a spacecraft 100 that requires 1 kW of power to operate using a solar power supply that generates a maximum of 25 kW would start a mission to Jupiter (at a distance of 5 AU) from Earth (at a distance of 1 AU) with an initial concentration ratio of 1/25. As the spacecraft 100 travels further away from Earth (and the Sun), the light intensity decreases resulting in decreasing power output from the energized solar cells. Therefore, as the spacecraft 100 travels further away from Earth, the concentration ratio is increased recruiting an increasing number of solar cells to generate electrical power. By the time the spacecraft 100 arrives at Jupiter, the concentration ratio is 25:1 energizing all of the available solar cells to generate the required 1 kW to operate the spacecraft 100.

The solar power supply 220 of a spacecraft 100 with destinations closer to the Sun than Earth may also be controlled using a concentration ratio. For example, a spacecraft 100 on a mission to Venus powered by a solar concentrator array with a maximum capacity of 1 kW on Earth may begin the mission on Earth with all solar cells energized. The concentration ratio may then be decreased as the spacecraft 100 approaches Venus. So as the spacecraft 100 approaches Venus, the number of solar cells energized to power the spacecraft 100 is decreased.

Additionally, as the spacecraft 100 travels closer to the Sun on missions to Venus, Mercury, or other locations in the solar system that are closer to the Sun than the Earth, the amount of heat produced on the spacecraft 100 increases as the intensity of the sunlight 114 increases. This heat will be especially concentrated on the solar panel 102 and 104 and the surface of the spacecraft main body 110. By controlling the position of the reflectors 210 within the plurality of solar concentration modules (such as, for example, 200), part of the impinging sunlight 114 on the solar panels 102 and 104 may be reflected off the solar panels 102 and 104 thus reducing the amount of heat produced by the sunlight 114 impinging on the solar panels 102 and 104. Through this process, the local temperatures corresponding to the position of the solar concentration modules may be reduced and controlled (i.e., thermally managed) by the controller 228 that monitors the local temperatures utilizing the corresponding temperature sensor 236a through 236i, determines which reflectors 210 in the corresponding solar concentrator arrays (such as, for example, 224) need to be moved into an off-pointing position that reflects off part, or all, of the impinging sunlight 114 on the solar concentrator arrays.

As noted above, the concentration ratio is varied during a mission because the available power output of the solar power supply 220 changes as the spacecraft 100 moves closer or away from the Sun. In an example implementation, the concentration ratio may be determined by the processor 230 and provided to each solar concentrator module 222a through 222i by the control signal 234 from the controller 228 to each control module (such as, for example, 106) of each solar concentrator module 222a through 222i. Each solar concentrator module 222a through 222i applies the concentration ratio by identifying a selected number of reflectors to orient into the solar cell energizing position, where the selected number of reflectors corresponds to the concentration ratio of reflectors out of the total number of reflectors in each solar concentrator module 222a through 222i.

The concentration ratio may also be determined and used by the processor 230 to calculate the number of reflectors in the solar concentrator array 224 to orient into the solar cell energizing position out of the total number of reflectors. The controller 228 may then signal each control module (such as, for example, 212) of each solar concentrator module 222a through 222i with the number of reflectors to orient in the solar cell energizing position.

Likewise, in a thermal management application, the processor 230 may determine the number of reflectors in the solar concentrator array 224 to orient into the off-pointing position out of the total number of reflectors. The controller 228 may then signal each control module (such as, for example, 212) of each solar concentrator module 222a through 222i with the number of reflectors to orient in the off-pointing position.

Figure 3:
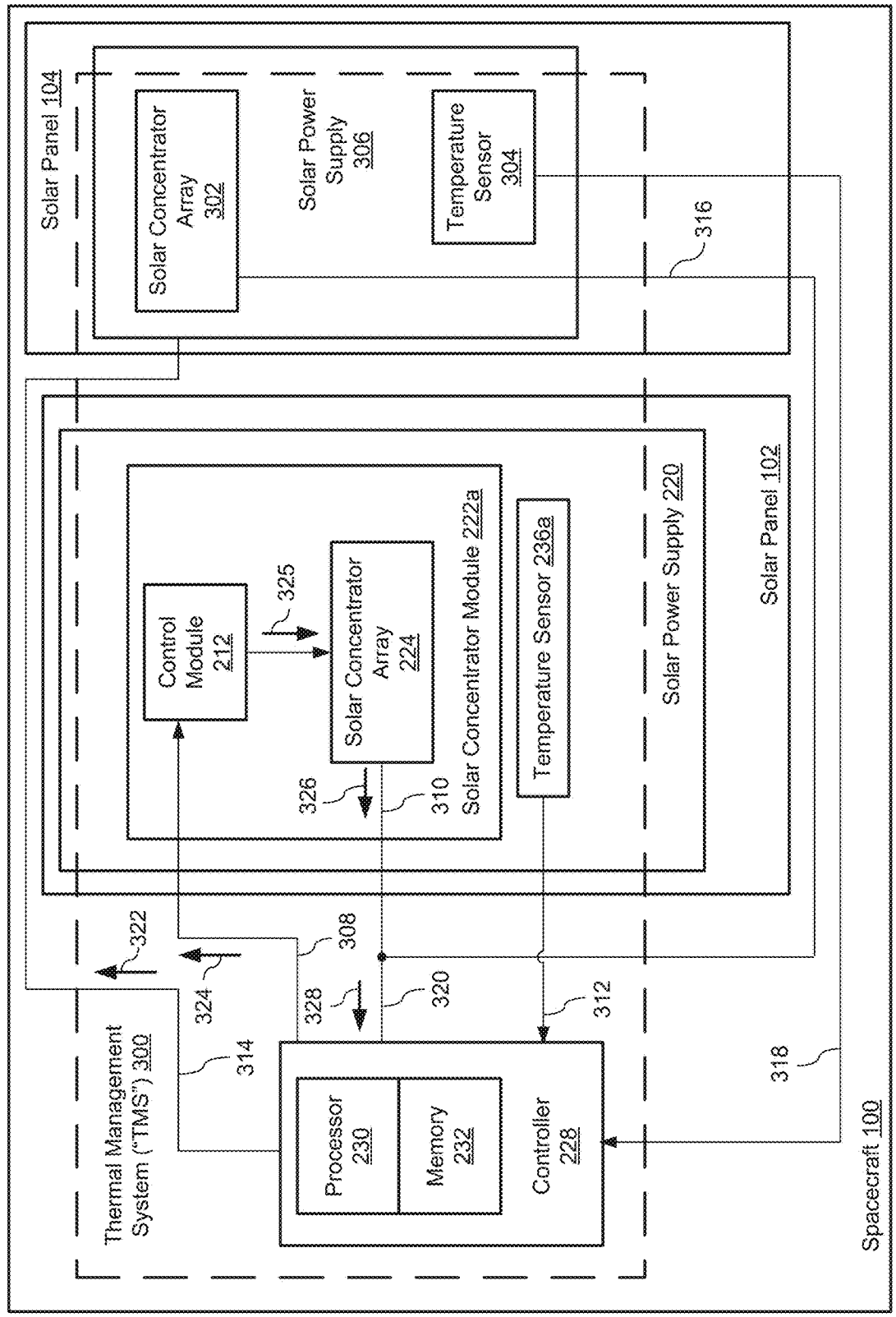
FIG. 3 is a system block diagram is shown of an example of an implementation of the thermal management system ("TMS") in accordance with the present disclosure in accordance with the present disclosure.

In FIG. 3, a system block diagram is shown of an example of an implementation of the TMS 300 in accordance with the present disclosure. As described earlier, in this example the TMS 300 includes a solar concentrator array (such as, for example, 222a), a temperature sensor (such as, for example 236a), and a controller (such as, for example, 228). For the simplicity of illustration, only the first solar panel 102 is shown having a solar power supply (such as, for example 220), where the solar power supply 220 includes a control module (such as, for example 212) and solar concentrator array (such as, for example 224), while the second solar panel 104 is shown having a solar concentrator array 302 and temperature sensor 304 which a second power supply 306. However, it is appreciated that the same type of components, module, device, and systems would also be present in the solar power supply 306 of the second solar panel 104. In this example, the second solar power supply 306 is shown to include a solar concentrator array 302 and temperature sensor 304 similar to the solar concentrator array 224 and temperature sensor 236a. Again as discussed earlier, while not shown in FIG. 3, it is appreciated by those of ordinary skill in the art that the solar concentrator array 302 would be part of solar concentrator module (not shown but similar to solar concentrator module 222a) and controlled by a control module (not shown but similar to control module 212). Additionally, it is appreciated that controller 228 controls both the first solar concentrator module 222a and a second solar concentrator module (not shown), within the solar power supply 306 of the second solar panel 104, that includes the second solar concentrator array 302. Moreover, it is appreciated that for the purposes of illustration only two solar panels 102 and 104 have been shown where the first solar panel 102 includes greater detail than the second solar panel 104; however, the spacecraft 100 may include a plurality of solar panels (not shown) up any number determined by the design of the spacecraft 100. In this example, each solar panel (such as for example both solar panels 102 and 104) will be configured with the same type of devices, components, and modules such that, for example, the solar power supply 306 will also include a solar concentrator module (not shown) that will be the same type of device, component, or module as solar concentrator module 222a including the solar concentrator array 302 that will be the same type of device, component, or module as solar concentrator array 224 and a control module (i.e., a second control module) that will also be the same type of device, component, or module as control module 212 in signal communication with controller 228. In these examples the control modules (such as, for example, the first control module 212 and the second control module in the second solar power supply 306) will generally not communicate with each other but will receive control signals 324 and 322, respectively, from the controller 228 that will determine how the solar concentrator arrays 224 and 302 should react in response to receiving temperature information data 312 and 318, respectively, from the first temperature sensor 236a and second temperature sensor 304.

In this example, the TMS 300 is configured to control the temperature of either the first solar panel 102, second solar panel 104, or both. The TMS 300 includes at least the first solar concentrator array 224 (within the solar concentrator module 222a), a first temperature sensor 236a, and controller 228, where, in this example, the solar concentrator module 222a and first temperature sensor 236a are part of the solar power supply 220 within the first solar panel 102. The TMS 300 may also include an additional plurality of solar concentrator arrays on the solar power supply 220, of the first solar panel 102, configured within a plurality of solar concentrator modules 222b through 222i (as shown in FIG. 2B) and an additional plurality of temperature sensors 236b through 236i (also shown in FIG. 2B). Furthermore, the TMS 300 may also include one or more solar concentrator arrays (including solar concentrator array 302) within one or more solar concentrator modules (not shown) and one or more temperature sensors (including temperature sensor 304). In this example, the one or more solar concentrator arrays and temperature sensors are also on the second solar power supply 306 of the second panel 104, similar to the first solar panel 102. As described earlier, each of the solar concentrator arrays (including solar concentrator arrays 224 and 302) may have a plurality of photovoltaic cells and a plurality reflectors arranged in reflector groups corresponding to the plurality of photovoltaic cells. Alternatively, in a non-solar power example, each (or some) of the solar concentrator arrays may lack the photovoltaic cells and be utilized exclusively for thermal heat management without power generation. Additionally, each of the temperature sensors (including temperature sensors 236a and 304) are configured to monitor the temperature of the solar panels 102 and 104 for local temperature valves at location of the temperature sensors that are generally close to the locations of the plurality of solar concentrator modes on both solar panels 102 and 104.

The controller 228 is in signal communication with both the first solar power supply 220 and second solar power supply 306 via signal paths 308, 310, 312, 314, 316, and 318, respectively. Specifically, in this example, the controller 228 is in signal communication with the control module 212 (which may be referred to as a first control module 212 since the second solar concentrator array 302 will include a second control module (not shown)) and the solar concentrator array 224 of the solar concentration module 222a via signal paths 308 and 310, respectively. The temperature sensor 236a is in signal path with the controller 228 via signal path 312. The second solar power supply 306 is in signal communication with the controller 228 via signal paths 314, 316, and 318, where the controller 228 is in signal path with the second controller module (not shown) and the solar concentrator array 302 via signal paths 314 and 316, respectively, and with the temperature sensor 304 via signal path 318.

In this example, the controller 228 is shown to include the processor 230 and memory 232, where the memory 2232 may include a non-transitory computer-readable storage medium (i.e., a control module non-transitory computer-readable storage medium) storing executable instructions that, when executed by the processor 230, are operative to monitor at least one temperature of the solar panels 102 and 104 with the temperature sensors 236a and 304 and produce at least one control signal (322, 324, or both) to position a selected number of reflectors on the first solar concentrator array 224 and first solar concentrator array 302, respectively, into an off-pointing position in response to monitoring the temperature sensors 236a and 304, where the selected number of reflectors is determined to control the temperature of the solar panels 102 and 104.

In this example, the control module 212 (i.e., the first control module 212 since the second concentrator array 302 will have a second control module) is configured to receive the control signal 324 from the controller 228 and in response, produce a first control module signal 325 to position the selected number of reflectors on the solar concentrator array 224 into the off-pointing position in response to receiving the first control signal 324 from the controller 228. Moreover, in this example, the control module 212 includes the control module processor 242 and control module memory 244, where the control module memory 244 may include a non-transitory computer-readable storage medium (i.e., a control module non-transitory computer-readable storage medium) storing executable instructions that, when executed by the control module processor 212, are operative in producing the first control module signal 325.

As described earlier, the solar concentrator arrays 224 and 302 are configured to position the selected number of reflectors in each solar concentrator array 224 or 302 into the off-pointing position to control the temperature of the solar panels 102 and 104. It is appreciated that in this example, the solar concentrator arrays 224 and 302 having photovoltaic cells each produce a concentrator array power output that are transmitted to the controller 228 via signal paths 310 and 316, respectively. The concentrator array power output 326 from the solar concentrator array 224 may be combined with the individual output power from the other solar concentrator arrays in the other solar concentrator modules 222b through 222i to produce the concentrator array power output $V_{out}$ 226 shown in FIG. 2B. The concentrator array power output $V_{out}$ 226 may then be combined with the concentrator array power output (not shown) off all the solar concentrator modules (not shown) in the second power supply 306 to produce a combined concentrator array power output 328 that is transmitted to the controller 228 via signal that 320 that is in signal communication with both signal paths 310 and 316.

It is appreciated by those of ordinary skill in the art that the circuits, components, modules, and/or devices of, or associated with, the spacecraft 100, solar power supplies 220 and 306, controller 228, and TMS 300 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

Figure 4A:
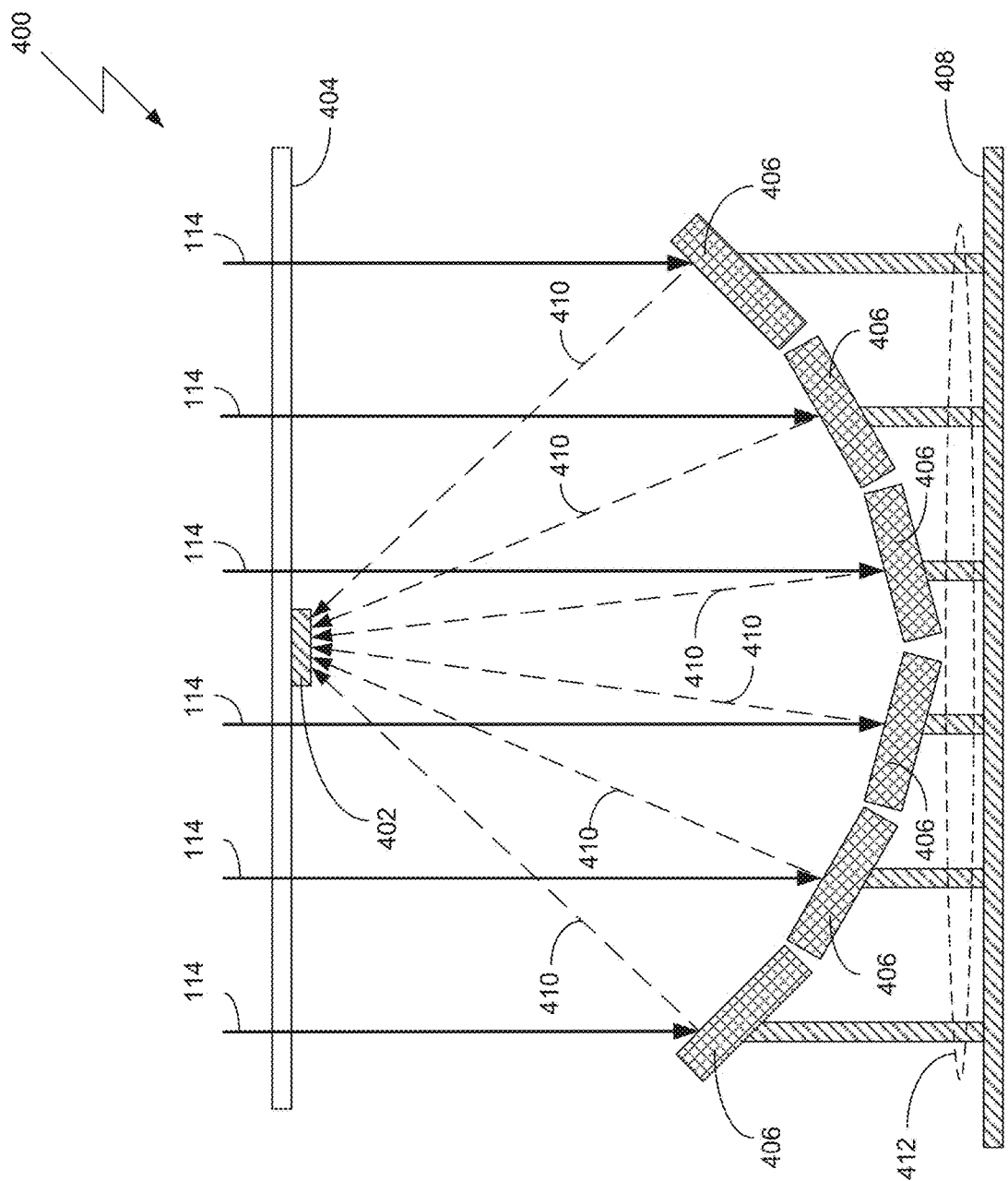
FIG. 4A is a cross-sectional view of an example of a solar cell and corresponding reflectors in a solar cell energizing position in accordance with the present disclosure.

FIG. 4A is a cross-sectional view of an example of a solar cell and reflector group unit 400 that may be used in the concentrator array 224 in FIG. 3B. In this example, the solar concentrator array includes a photovoltaic cell (i.e., the solar cell) for power generation. The solar cell and reflector group unit 400 in FIG. 4A includes a solar cell 402 mounted on a first planar substrate 404, preferably made of glass, or some other suitable transparent material as described above with reference to FIG. 3A. The corresponding reflector group includes a plurality of reflectors 406 mounted on a second planar substrate 408 spaced apart from, and in parallel with, the first planar substrate 404 so that the solar cell 402 is directly opposite the reflectors 406 in the reflector group. The first and second substrates 404 and 408 are oriented so that sunlight 114 is incident to the panel at the first planar substrate 404. While the sunlight 114 is shown in FIG. 4A directed to the first planar substrate 404 at a substantially normal incident angle, the reflectors 406 may be adjusted to maintain light directed at the solar cell 402 when the angle of incidence of the sunlight 114 shifts away from normal as described below with reference to FIG. 4C. In this example, the sunlight 114 passes through the clear first planar substrate 404 towards the reflectors 406 in the reflector group. The reflectors 406 reflect and direct the reflected and directed sunlight 410 back towards the solar cell 402 on the first planar substrate 404.

In the examples of the various implementations described in this disclosure, the solar cell 402 may be any suitable electronic component that receives light and generates an electrical signal indicative of the light intensity. The corresponding reflectors 406 include mirrors arranged to reflect light back towards the solar cell 402. In the example of the various implementations, the reflectors 406 may be implemented as Micro-Electro-Mechanical Systems ("MEMS") components incorporating miniaturized mirrors and control components to increase the density of solar cell and reflector group units 400 on the concentrator array. Each reflector 406 may be controlled by an actuator 412, which is configured to orient the reflector 406 by rotating the mirror about one or more dimensions. The actuator 412 may also provide translation orientation by moving the reflector closer to, or further away from the solar cell 402. The actuator 412 may receive signals from the control module 212 that move the reflectors 406 as commanded by the control module 212.

By controlling the orientation of each reflector, the control module 212 may control the intensity of sunlight 114 directed to the solar cell corresponding to the reflector. For example, the control module 212 may send signals to each reflector 406 in the reflector group to direct the reflected and directed sunlight 410 to the solar cell 402 as shown in FIG. 4A. This position for each reflector 406 in FIG. 4A may be referred to as the solar cell energizing position, which is the position or orientation of the reflector 406 that allows the reflector 406 to direct light to the solar cell 402.

Figure 4B:
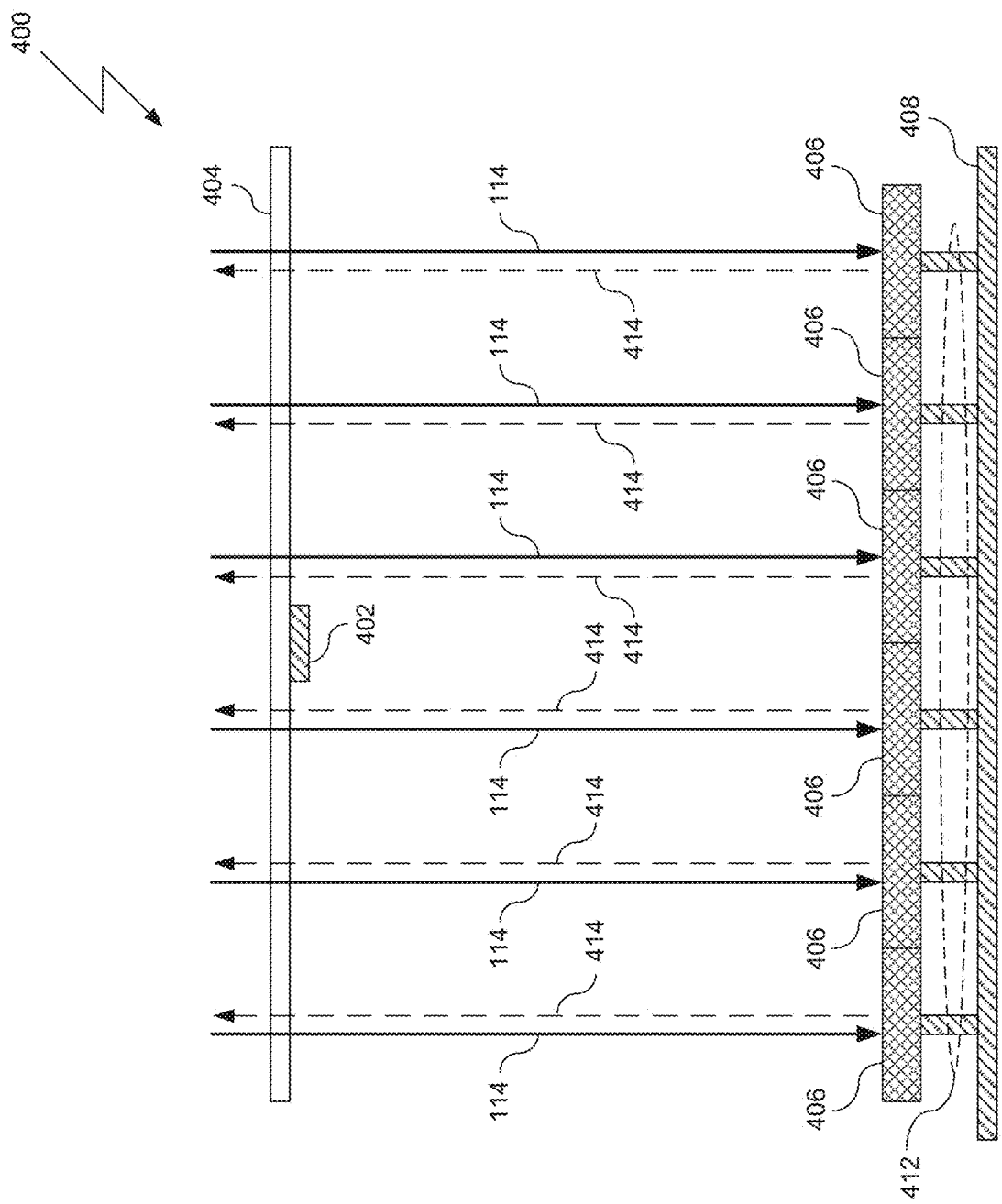
FIG. 4B is a cross-sectional view of an example of a solar cell and corresponding reflectors in the solar cell non-energizing position in accordance with the present disclosure.

FIG. 4B is a cross-sectional view of the solar cell and reflector group unit 400 with the reflectors 406 oriented in a solar cell non-energizing position. The control module 212 may send signals to the actuators 412 to orient the reflectors 406 to point the reflected sunlight 414 in a direction away from the solar cell 402 (unlike the reflected and directed sunlight 410 that is directed towards the solar cell 402). When the reflectors 406 direct the reflected sunlight 414 so that the reflected sunlight 414 does not energize the solar cell 402, the solar cell 402 does not generate an electrical signal and does not contribute to the electrical power output of the concentrator module 222*a* through 222*i* (in FIG. 2B). In this example, the reflectors 406 in FIG. 4B are shown oriented to direct the reflected sunlight 414 back along the angle of incidence of the sunlight 114. The solar cell non-energizing position may however be any position or orientation of the reflectors 406 that allow the reflector 406 to direct light in any direction that is not towards the solar cell 402.

Similarly, the solar cell non-energizing position also corresponds to the an off-pointing position for thermal management because the reflected sunlight 414 is not absorbed by the reflector group unit 400 and reflected back into outer space and away from the spacecraft 100. As such, this off-pointing position (which also corresponds to the solar cell non-energizing position) reduces the local temperature of solar panel 102 or 104 at the position of reflector group unit 400 within the solar panel 102 or 104.

As noted above, the concentration ratio may be defined in terms of the number of reflector groups less than the total number of reflector groups having all of the reflectors in the solar cell energizing position. FIGS. 4A and 4B illustrate how the concentration ratio defined in this way may be used to control the power output of the solar concentrator array 224. If all of the reflectors 406 in each solar cell and reflector group unit 240 are oriented in the solar cell energizing position as shown in FIG. 4A, each solar cell 402 is generating substantially a maximum electrical output corresponding to the incident light intensity. If all of the reflectors 406 in each solar cell and reflector group unit 240 are oriented in the solar cell non-energizing position as shown in FIG. 4B, there would be effectively no power output from each corresponding solar cell 402. Increasing the concentration ratio increases the number of reflector groups with all reflectors in the solar cell energizing position resulting in a higher power output. Decreasing the concentration ratio decreases the number of reflector groups with all reflectors in the non-solar cell energizing position (also corresponding to off-pointing position) resulting in a lower power output and reduces the amount of heat that is produced on the solar concentration array 224 by directing the reflected sunlight 414 off the solar concentration array 224 without collecting any of the sunlight 114 on the solar cell 402.

The solar cell energizing position may vary during operation of the spacecraft 100. As noted above, angle of incidence of the light on the cover panel of the solar power supply 220 may vary from substantially 90°. The spacecraft 100 may include hardware and software components that control the orientation and position of the solar power supply 220 to maintain the substantially 90° angle of incidence as the spacecraft 100 travels in space. It may not always be possible for the spacecraft 100 to maintain the 90° angle of incidence of light on the solar power supply 220. If the substantially 90° angle of incidence of light cannot be maintained, the reflectors 406 in the reflector groups energizing the solar cells 402 may be adjusted to maintain a maximum intensity on the energized solar cells 402. In effect, the solar cell energizing position of the reflectors 406 is modified in response to the changes in orientation of the solar power supply 220.

Figure 4C:
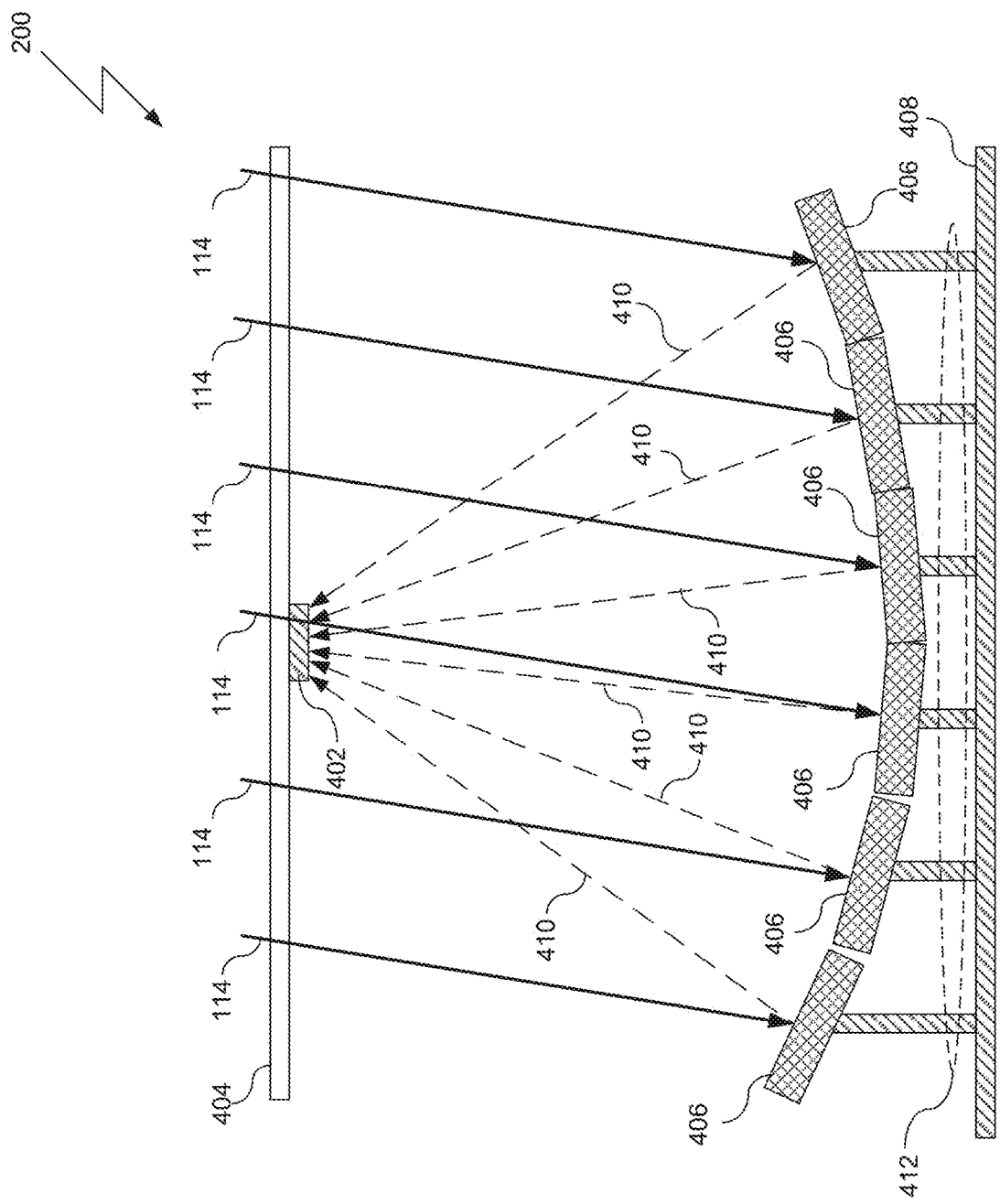
FIG. 4C is a cross-sectional view of an example of a solar cell and corresponding reflectors in a solar cell energizing position when sunlight is not normal to the solar power supply in accordance with the present disclosure.

FIG. 4C is a cross-sectional view of the solar cell 402 and corresponding reflectors 406 in the solar cell energizing position when the sunlight 114 is not normal to the solar power supply 220 (FIG. 2B). The angle of incidence of the sunlight 114 in the example illustrated in FIG. 4C is not substantially 90° unlike the angle of incidence of sunlight 114 shown in the examples in FIGS. 4A and 4B. As the angle of incidence varies away from normal, the control module 212 (in FIG. 2B) controls the reflectors 406 by signaling the actuators 412 to position the reflectors 406 to keep directing the reflected sunlight 410 to the solar cell 402. Accordingly, the solar energizing position of the reflectors 406 varies depending on the reflector and on the angle of incidence of sunlight 114. Similarly, the off-position of the reflectors 406 to reflect off the impinging sunlight 114 and control the local temperature near the solar concentrator array 224 also varies depending on the reflector and on the angle of incidence of sunlight 114.

Figure 4D:
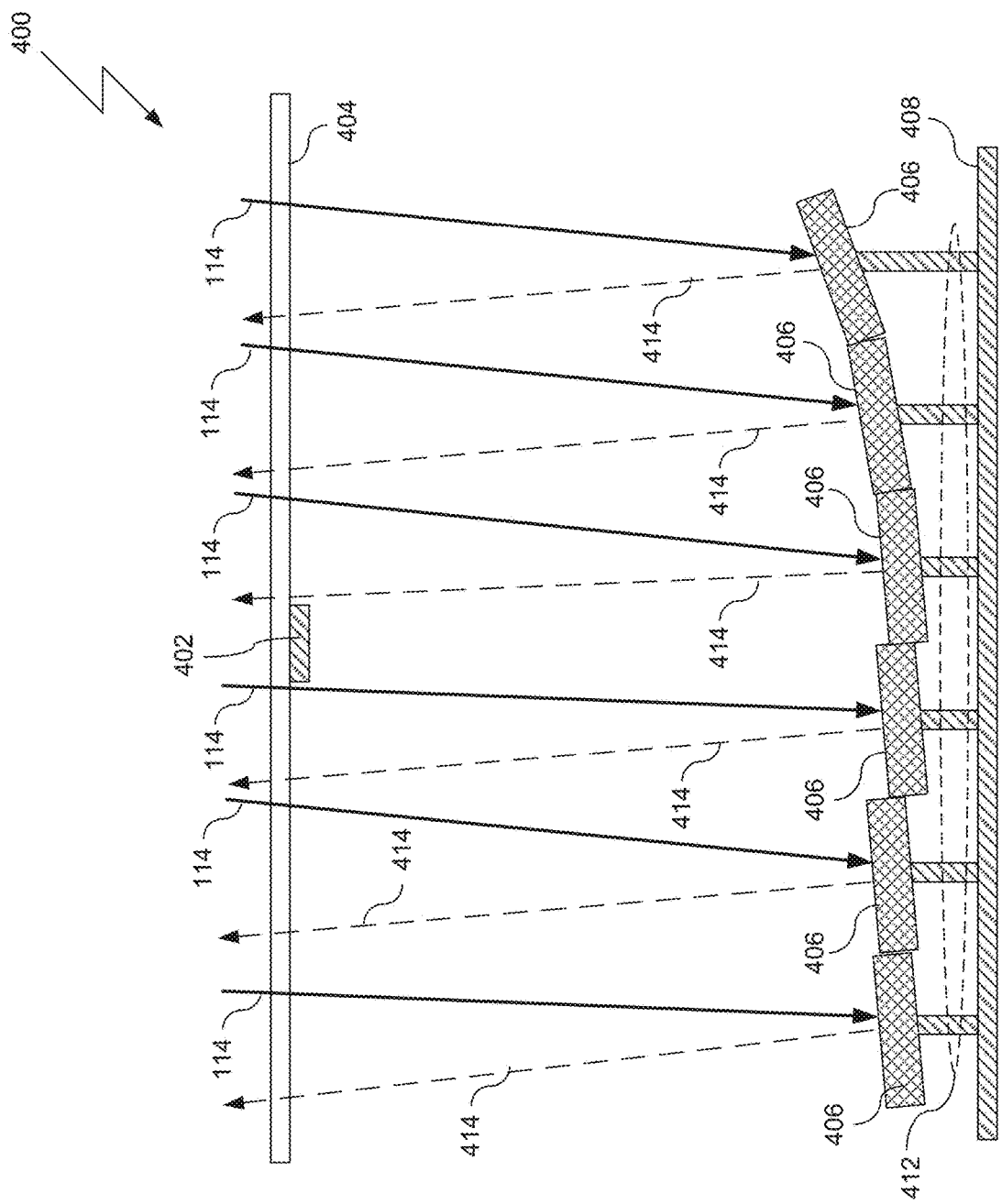
FIG. 4D is a cross-sectional view of another example of an implementation of the solar cell and corresponding reflectors in the solar cell non-energizing position when the sunlight is not normal to the solar power supply in accordance with the present disclosure.

Turning to FIG. 4D, a cross-sectional view is shown of another example of an implementation of the solar cell 402 and corresponding reflectors 406 in the solar cell non-energizing position when the sunlight 114 is not normal to the solar power supply 220. Similar to the example shown in FIG. 4B, in this example, the control module 212 may send signals to the actuators 412 to orient the reflectors 406 to point the reflected sunlight 414 in a direction away from the solar cell 402 (unlike the reflected and directed sunlight 410 that is directed towards the solar cell 402). Again, when the reflectors 406 direct the reflected sunlight light 414 so that the reflected sunlight 414 does not energize the solar cell 402, the solar cell 402 does not generate an electrical signal and does not contribute to the electrical power output of the concentrator module 222a through 222i (in FIG. 2B). In this example, the reflectors 406 in FIG. 4B are shown oriented in an off-pointing position to direct the reflected sunlight 414 at an oblique angle away from the angle of incidence of the sunlight 114. Since the reflected sunlight 414 does not illuminate the solar cell 402 the solar cell is in a non-energizing position and the reflector group unit 400 does not absorb heat energy from the sunlight 114 because it is reflected back into outer space and away from the spacecraft 100. As such, this off-pointing position also reduces the local temperature of solar panel 102 or 104 at the position of reflector group unit 400 within the solar panel 102 or 104.

Figure 4E:
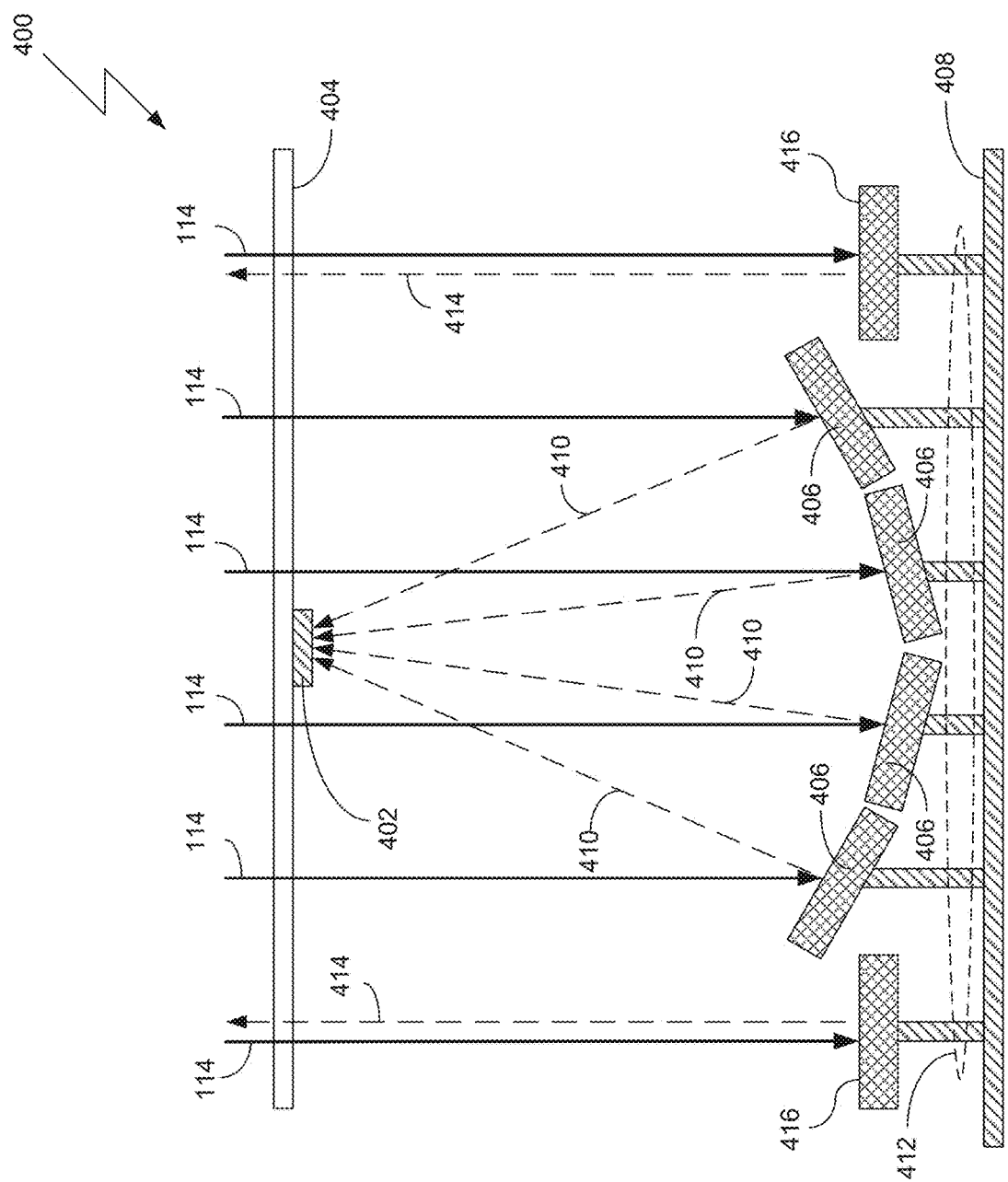
FIG. 4E is a cross-sectional view of an example of a solar cell and corresponding reflectors where selected reflectors are in the solar cell energizing position and other reflectors are in the solar cell non-energizing position in accordance with the present disclosure.

As noted above, the concentration ratio may be defined in terms of the total number of reflectors in a concentrator array, or in the solar power supply. This may result in applying the concentration ratio to the number of reflectors in a reflector group. FIG. 4E is a cross-sectional view of the example solar cell 402 and corresponding reflectors where, selected reflectors 406 are in the solar cell energizing position and other reflectors 416 are in the solar cell non-energizing position. When the selected number of reflectors 406 oriented into the solar cell energizing position is less than all of the reflectors in the reflector group, the solar cell 402 generates less than the maximum amount of electrical power. Some reflectors 406 in a reflector group would be placed into the solar cell energizing position, and other reflectors 416 in the same reflector group would be placed in the solar cell non-energizing position as shown in FIG. 4E. The total number of selected reflectors 406 placed in the solar cell energizing position in the concentrator array may correspond to the concentration ratio of the total number of reflectors in the concentration array. In this example, the reflectors 416 are in an off-pointing position in relation to the other reflectors 406 that are in a non-off-pointing position because the reflectors 416 are directing the reflected sunlight 414 away from the reflector group unit 400 into outer space while the other reflectors 406 are directing the reflected sunlight 410 to the solar cell 402. As such, the reflectors 416 in the off-pointing position are also reducing and controlling the local temperature at the reflector group unit 400.

The use of the concentration ratio to control the power output of the solar concentrator array 224 advantageously ensures that the spacecraft 100 power requirements are being met without generating an excessive power level. As an example, a spacecraft 100 that requires 1 kW of power traveling from Earth to Jupiter would set an initial concentration ratio to less than the maximum concentration ratio sufficient to generate 1 kW of power, and increase the concentration ratio until the maximum concentration ratio is reached near Jupiter to generate the same 1 kW of power. Similarly, a spacecraft 100 that requires 1 kW of power traveling from Earth to Venus would set an initial concentration ratio to the maximum concentration ratio sufficient to generate 1 kW of power, and decrease the concentration ratio until the minimum concentration ratio needed to generate the same 1 kW of power on Venus is reached. Additionally, the use of the concentration ratio may also be utilized to thermally manage the local temperature of the solar concentration modules.

Figure 5:
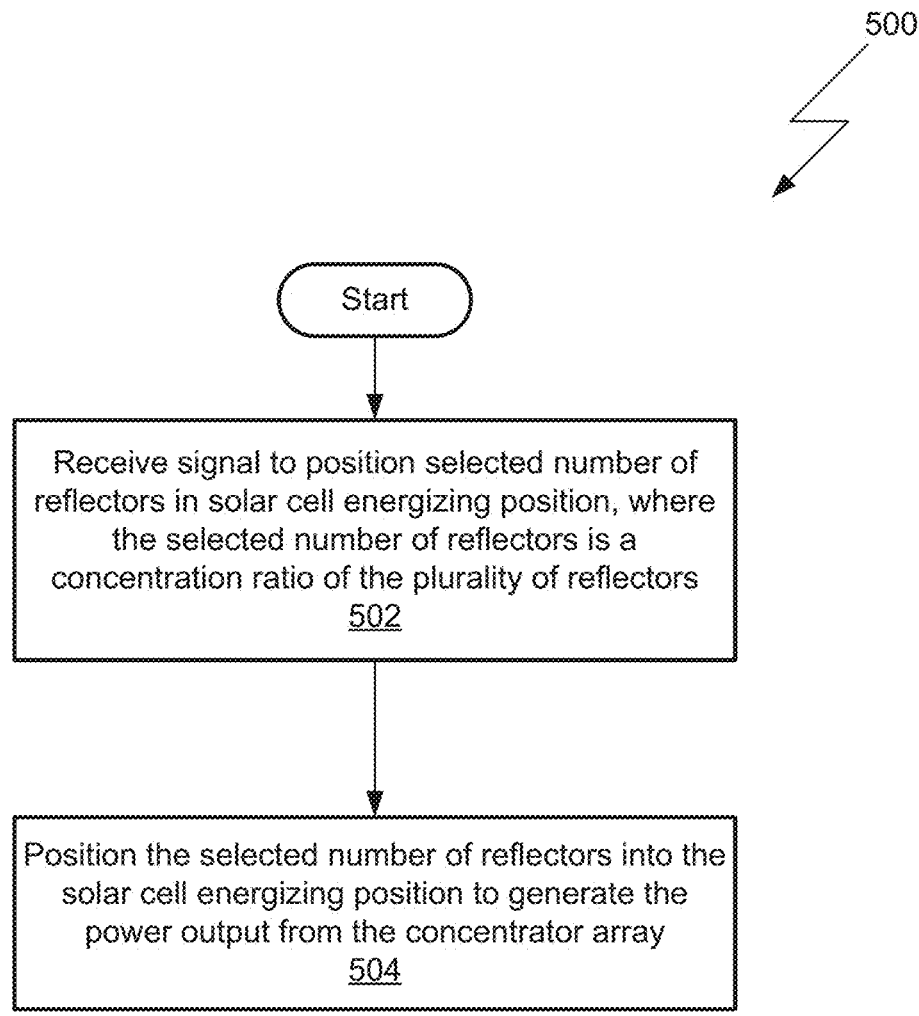
FIG. 5 is a flowchart illustrating operation of an example method for controlling power output from a concentrator array in accordance with the present disclosure.
Figure 6:
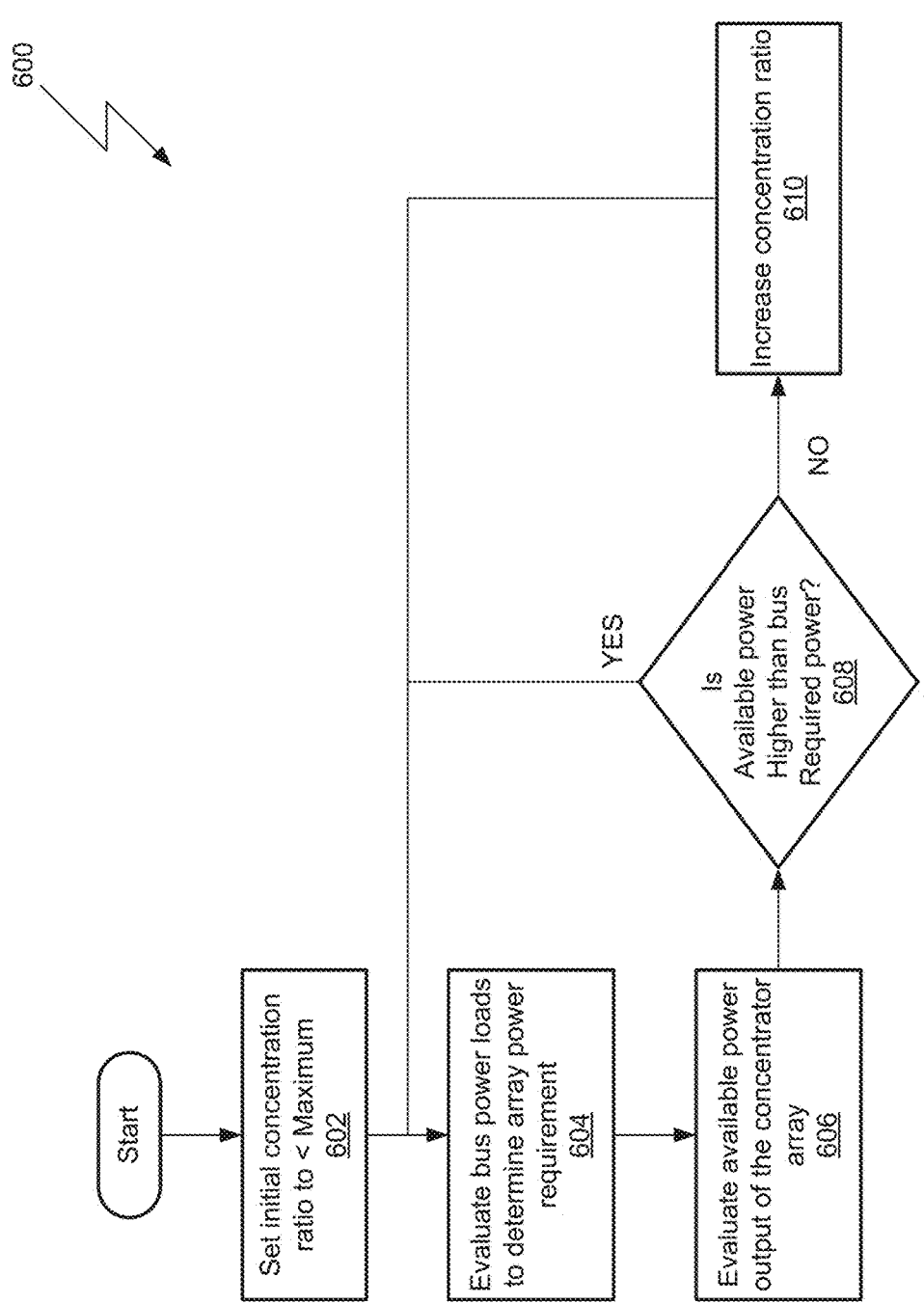
FIG. 6 is a flowchart illustrating operation of an example of a method for varying the concentration ratio for a spacecraft traveling away from the Sun in accordance with the present disclosure.
Figure 7:
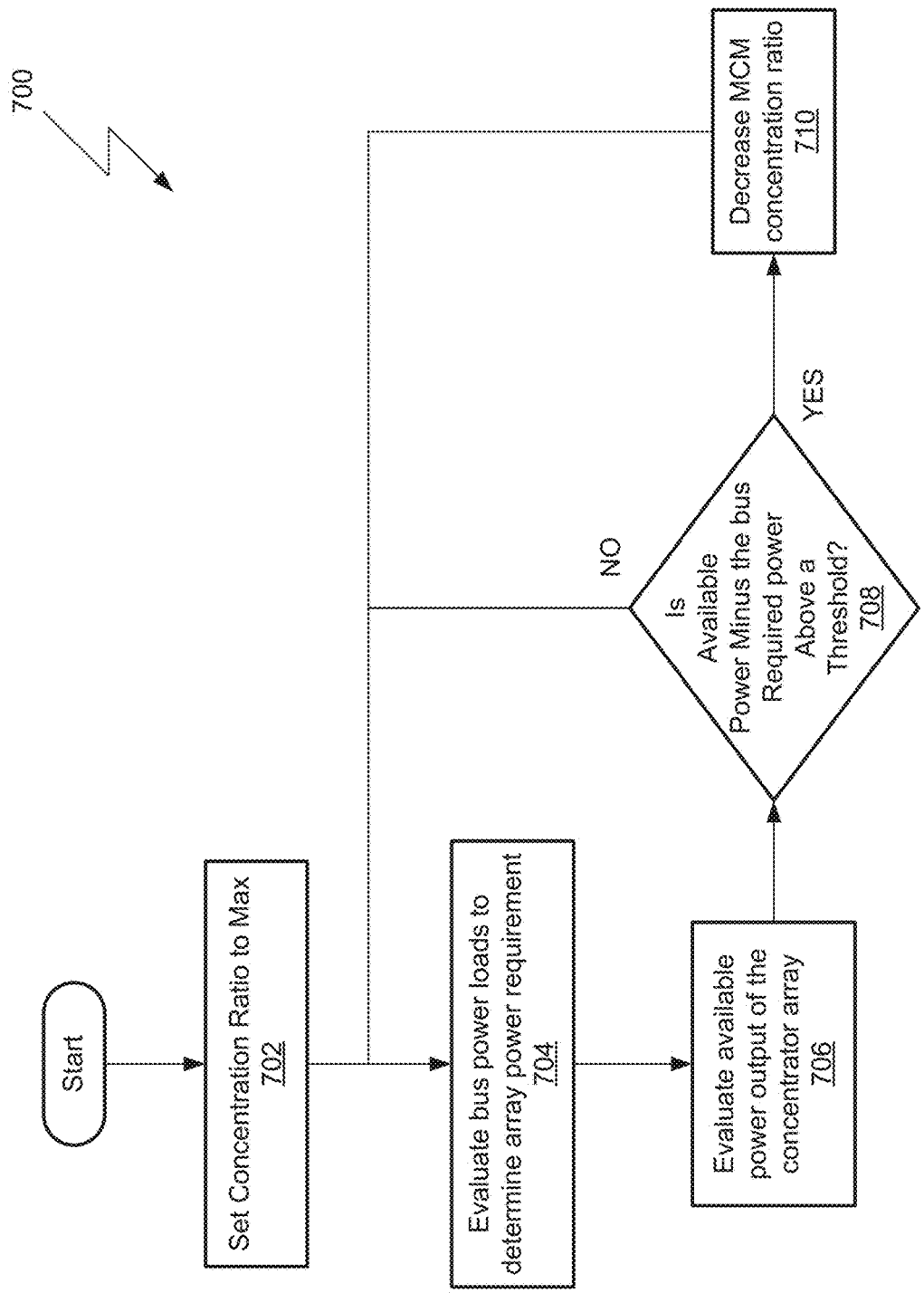
FIG. 7 is a flowchart illustrating operation of an example of a method for varying the concentration ratio for a spacecraft traveling towards the Sun in accordance with the present disclosure.

FIGS. 5 through 7 are flowcharts illustrating methods for controlling the power output of a solar concentrator array using the concentration ratio. It is noted that the methods illustrated in FIGS. 5 through 7 assume the concentration ratio is based on monitoring the available power output and the spacecraft 100 power requirement. As noted above, the concentration ratio may be determined using other methods such as, without limitation, on the distance to the Sun. In the following description of the methods in FIGS. 5 through 7, reference is made to components shown in FIG. 2B unless otherwise specified. The methods in FIGS. 5 through 7 may be implemented as software components including computer-implemented instructions stored in memory and executed by a processor in either the control module 212 or in another computing device on the spacecraft 100.

FIG. 5 is a flowchart illustrating operation of a first example method 500 for controlling power output from a solar concentrator array 224. In the non-limiting example of an implementation illustrated in FIG. 2B, the controller 228 determines the concentration ratio and communicates the information relating to the concentration ratio (or the concentration ratio itself) to the control module 212. At step 502, the control module 212 receives a signal or command to position a selected number of reflectors in the solar cell energizing position, where the selected number of reflectors is a concentration ratio of the reflectors on the solar concentrator array 224.

At step 504, the control module 212 positions the selected number of reflectors on the solar concentrator array 224 into the solar cell energizing position to generate the power output from the solar concentrator array 224. The control module 212 positions the reflectors by signaling the actuators corresponding to the selected number of reflectors.

As noted above, the concentration ratio may be advantageously adjusted for spacecraft 100 traveling away from the Sun and for spacecraft 100 traveling towards the Sun. FIG. 6 is a flowchart illustrating operation of an example of a method 600 for varying the concentration ratio for a spacecraft traveling away from the Sun. The method 600 in FIG. 6 may be performed by the controller 228 in order to determine the concentration ratio to signal to the control modules 212 in each solar concentrator modules 222a through 222i. In an alternative example, the solar power supply 220 may be implemented using a single solar concentrator module 222a through 222i with a control module 212 that performs the operations described herein for the controller 228.

At step 602, an initial concentration ratio less than a maximum concentration ratio is determined. In the example above for the spacecraft traveling to Jupiter with a spacecraft power requirement of 1 kW and a total maximum power output capacity of 25 kW, the initial concentration ratio may be set to 1/25 to generate the required 1 kW while substantially at Earth. The number of reflector groups corresponding to 1/25 is selected and oriented to the solar cell energizing position. At step 604, the controller 228 may evaluate bus power loads to determine the spacecraft power requirement. At step 606, the available power output from the solar concentrator array 224, or arrays, is measured. As noted above, the available power output would decrease as the spacecraft 100 travels further from the Sun due to the decreasing intensity of the sunlight 114.

At decision block 608, the available power output is compared to the spacecraft 100 power requirement. If the available power output is higher than the spacecraft 100 power requirement (the YES path), the concentration ratio may be left unchanged. If the available power output is less than the spacecraft 100 power requirement (the NO path), the concentration ratio may be increased at step 610. It is noted that a threshold may be applied where the available power should be maintained at the spacecraft power requirement plus a threshold.

Control in the method 600 proceeds from both decision block 608 and step 610 to step 604 to continuously monitor the spacecraft 100 power requirement and then to step 606 to continuously monitor the available power output.

FIG. 7 is a flowchart illustrating operation of an example of a method 700 for varying the concentration ratio for a spacecraft traveling towards the Sun. The method 700 in FIG. 7 may be performed by the controller 228 to determine the concentration ratio to signal to the control modules 212 in each solar concentrator modules 222a through 222i. In an alternative example, the solar power supply 220 may be implemented using a single solar concentrator module 222a through 222i with a control module 212 that performs the operations described herein for the controller 228.

At step 702, an initial concentration ratio greater than a minimum concentration ratio at an initial position is determined. In the example above for the spacecraft traveling to Venus with a power requirement of 1 kW and a total maximum power output capacity of 1 kW, the initial concentration ratio may be set to 10:1 to generate the required 1 kW while substantially at an initial position, which is the Earth. The number of reflector groups corresponding to 10:1, or all of the reflector groups, is selected and oriented to the solar cell energizing position. At step 704, the controller 228 may evaluate bus power loads to determine the power required from the concentrator array 224. At step 706, the available power from the solar concentrator array 224, or arrays, is measured. As noted above, the power output would increase as the spacecraft 100 travels towards the Sun due to the increased sunlight 114 intensity as the spacecraft 100 approaches the Sun.

At decision block 708, the available power output is compared to the spacecraft power requirement. If the available power output is less than the spacecraft power requirement (the NO path) plus a threshold, the concentration ratio may be left unchanged. If the available power is above the spacecraft power requirement plus the threshold (the YES path), the concentration ratio may be decreased at step 710. It is noted that the threshold may be a suitable value indicative of a power level that is deemed excessive.

Control in the method 700 proceeds from both decision block 708 and step 710 to step 704 to continuously monitor the spacecraft 100 power requirement and then to step 706 to continuously monitor the available power output.

Figure 8:
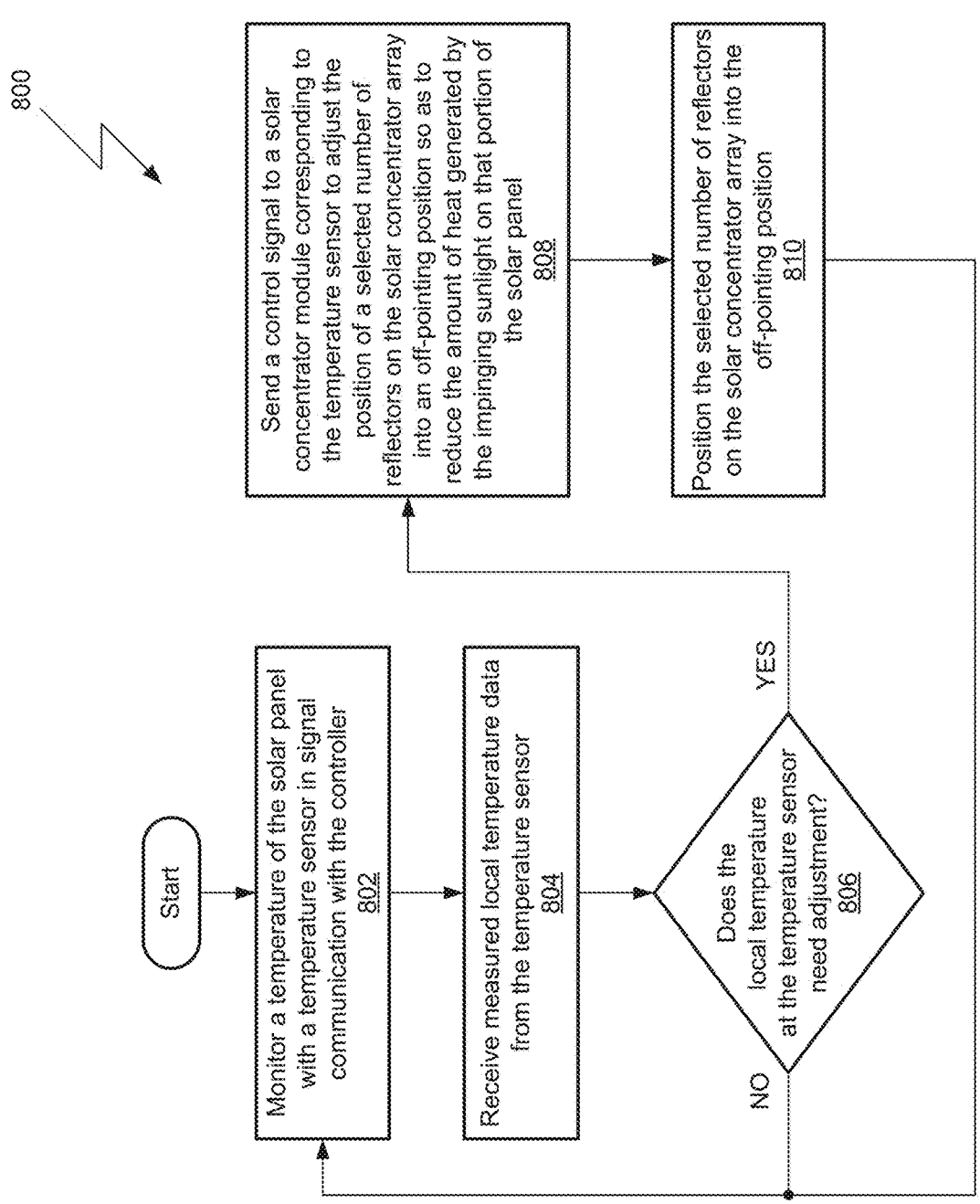
FIG. 8 is a flowchart illustrating an example of operation of a method for controlling a temperature of a solar panel having a solar concentrator array with the TMS in accordance with the present disclosure.

FIG. 8 is a flowchart illustrating an example of operation of a method 800 for controlling a temperature of a solar panel having a solar concentrator array with the TMS 300 in accordance with the present disclosure. In this example, the method the TMS 300 performs a process for controlling a temperature of a solar panel having a solar concentrator array, where the solar concentrator array has a plurality of photovoltaic cells and a plurality reflectors arranged in reflector groups corresponding to the plurality of photovoltaic cells. The method 800 includes monitoring 802 a temperature of the solar panel (either 102 or 104) with a temperature sensor (such as, for example, 236a) in signal communication with the controller 228. The temperature sensor produces a local temperature of the solar panel near a solar concentrator module (such as, for example, 222a) that is near the temperature sensor and sends the sensor data (that includes the measured local temperature data) to the controller 228. The controller 228 then receives 804 the measured local temperature data from the temperature sensor and determines (in decision step 806) if the local temperature of the solar panel needs to be adjusted. If the local temperature of the solar panel does not need to be adjusted the process returns to step 802 where the temperature sensors continues to monitor the local temperature of the solar panel at the position of the temperature sensor and the process repeats.

If, instead, the local temperature of the solar panel needs to be adjusted, the controller 228 sends a control signal 808 to the solar concentrator module corresponding to the temperature sensor to adjust the position of a selected number of reflectors on the solar concentrator array (corresponding to the solar concentrator module such as, for example, 224) into an off-pointing position so as to reduce the amount of heat generated by the impinging sunlight 114 on that portion of the solar panel. The solar concentrator module receives the control signal from the controller 228 and, in response, positions 810 the selected number of reflectors on the solar concentrator array into the off-pointing position. The process then returns to step 802 where the temperature sensors continues to monitor the local temperature of the solar panel at the position of the temperature sensor and the process repeats.

In this example, the control signal is received by a control module (such as, for example, 212) within the solar concentrator module and the controller 228, control module, or both determine the selected number and position of the reflectors that need to be placed in an off-pointing position to control the local temperature of the solar panel, where the control module controls the adjustment of the selected reflectors. In this example, another processor or controller on the spacecraft 100 may also be utilized in combination with the controller 228 and control module to determine the selected number and position of the reflectors that need to be placed in an off-pointing position to control the local temperature of the solar panel. In this example, by positioning the selected number of reflectors into the off-pointing position to control the local temperature of the solar panel by the controller 228, control module, or both thereby controls the temperature of the solar panel.

In this example, the step of positioning the first selected number of reflectors into the off-pointing position may include positioning the first selected number of reflectors into a partial off-pointing position or a full off-pointing position. Additionally, the step of positioning the first selected number of reflectors into the off-pointing position may include adjusting the position and angle of each reflector of first selected number of reflectors with a plurality of actuators within a first microconcentrator module ("MCM"). Furthermore, the step of receiving the first control signal from the controller may include receiving the first control signal at a first control module, and the step of positioning the first selected number of reflectors into the off-pointing position may include positioning the first selected number of reflectors in the solar concentrator array into the off-pointing position with the first control module in response to receiving the first control signal. Moreover, the method may also include: monitoring a second local temperature of the selectively reflective panel with a second temperature sensor in signal communication with the controller; receiving a second control signal from the controller to position a second selected number of reflectors on a second solar concentrator array into an off-pointing position in response to the received second control signal that corresponds to the monitored second local temperature, wherein the second selected number of reflectors is determined to control the second local temperature of the selectively reflective panel; and positioning the second selected number of reflectors into the off-pointing position to control the second local temperature of the selectively reflective panel. Still further, the method may also include: receiving a second temperature data from the second temperature sensor at the controller; determining the second selected number of reflectors on the second solar concentrator array to be placed into the off-pointing position in response to the second temperature data at the controller; and producing the second control signal, at the controller, in response to determining the second selected number of reflectors to be placed into the off-pointing position. Receiving the second control signal from the controller may include receiving the second control signal at a second control module and positioning the second selected number of reflectors into the off-pointing position may include positioning the second selected number of reflectors in the solar concentrator array into the off-pointing position with the second control module in response to receiving the second control signal.

Figure 9:
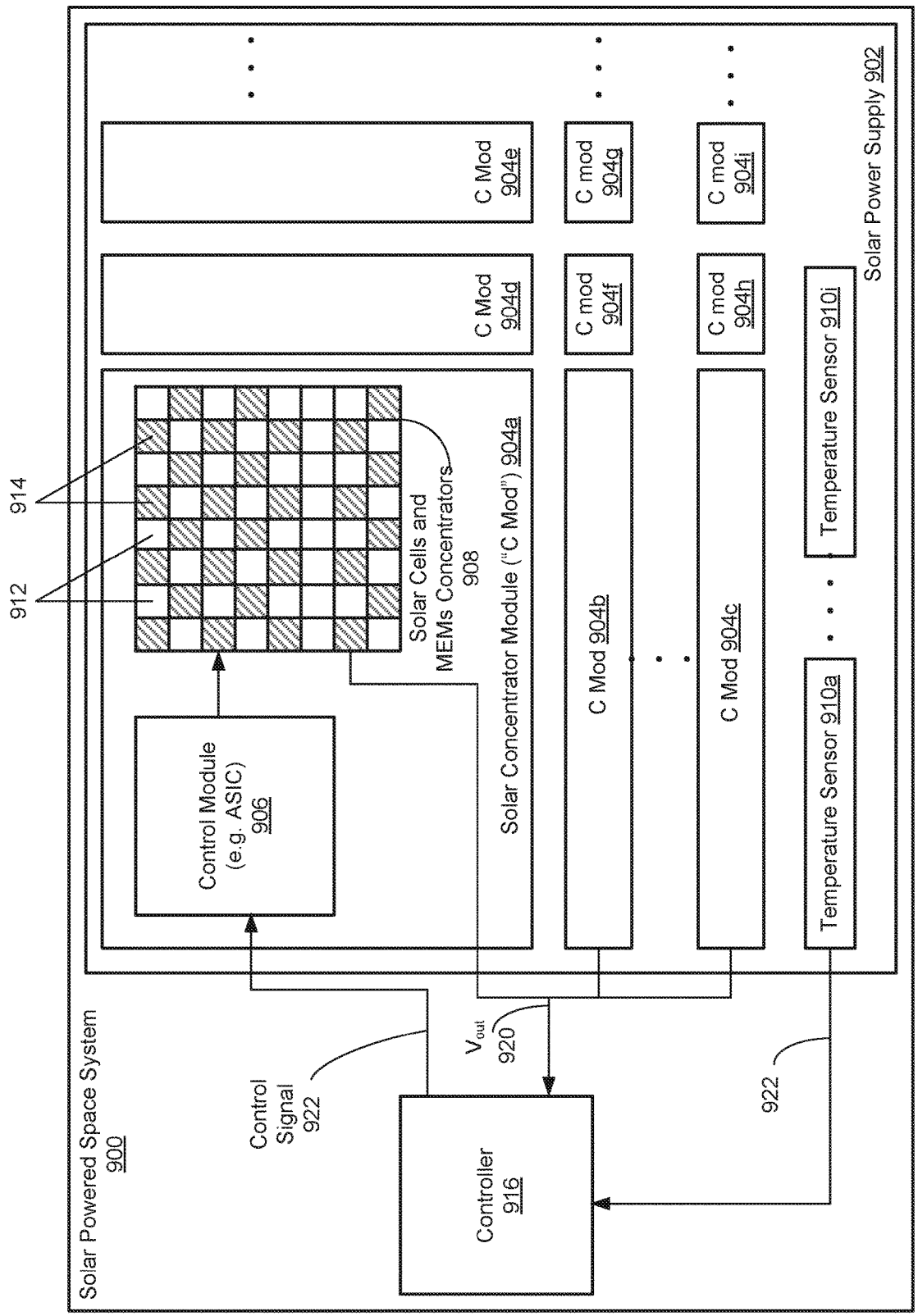
FIG. 9 is a block diagram of an example solar power supply illustrating one example of a method for energizing solar cells using the concentration ratio in accordance with the present disclosure.

As described above, the concentration ratio may be applied to selected numbers of reflectors individually or in reflector groups. FIG. 9 is a block diagram of an example of a solar powered space system 900 within the spacecraft 100 powered by the solar power supply 902 illustrating energizing reflector groups according to the concentration ratio. The solar power supply 902 includes a plurality of MCMs 904a through 904i, where each MCM 904a through 904i includes a control module 906 and a micro-concentrator array 908. The micro-concentrator array 608 in FIG. 9 includes solar cells and corresponding MEMS reflector groups. The MCMs 904a through 904i are examples of the concentrator modules 200 and 222a through 222i described above with reference to FIGS. 2A and 2B. The micro-concentrator array 908 is an example of the solar concentrator array 202 and 224 described above with reference to FIGS. 2A and 2B. The solar power supply 902 may also include a plurality of temperature sensors 910a through 910i that correspond to the temperature sensors at the positions of the MCMs 904a through 904i, respectively.

The control module 906 in the micro-concentrator array 904a in FIG. 9 may perform the methods 500 and 800 described above with reference to FIGS. 5 and 8. In this example, the control module 906 may be processor as described before or an application specific integrated circuit ("ASIC"), digital signal processor ("DSP"), field programmable gate array ("FPGA"), or other similar device or component. The number of reflectors according to the concentration ratio may be selected in reflector groups. In this way, the selected number of reflectors is a concentration ratio of the total number of reflector groups, which is the number of solar cells. All of the reflectors in each of the selected number of reflector groups are oriented into the solar cell energizing position as shown in FIG. 3A. FIG. 9 shows a first set of reflector groups 912 as reflector groups not selected to energize the solar cells corresponding to the first set of reflector groups 912. It is appreciated that the pattern is for purposes of illustration. A second set of reflector groups 914 indicated as grey squares in FIG. 9A is the selected number of reflector groups corresponding to a concentration ratio of one-half selected to energize the solar cells corresponding to each of the second set of reflector groups 914. The example in FIG. 9 illustrates selecting a concentration ratio of solar cells to energize to output the maximum power of each solar cell. The total power output from the micro-concentrator array 904a is a concentration ratio of the total power output capacity of the micro-concentrator array 904a. As before, the controller 916 may receive local temperature data from the temperature sensors 910a through 912i and an output voltage $V_{out}$ 920 from the MCMs 904a through 904i and, in response produce a control signals that may be sent to the plurality of MCMs 904a through 904i to control position of the reflectors in the solar cells and MEMs concentrators 908. In this example, the controller 916 may be processor as described before or an ASIC, DSP, FPGA, or other similar device or component.

Figure 10:
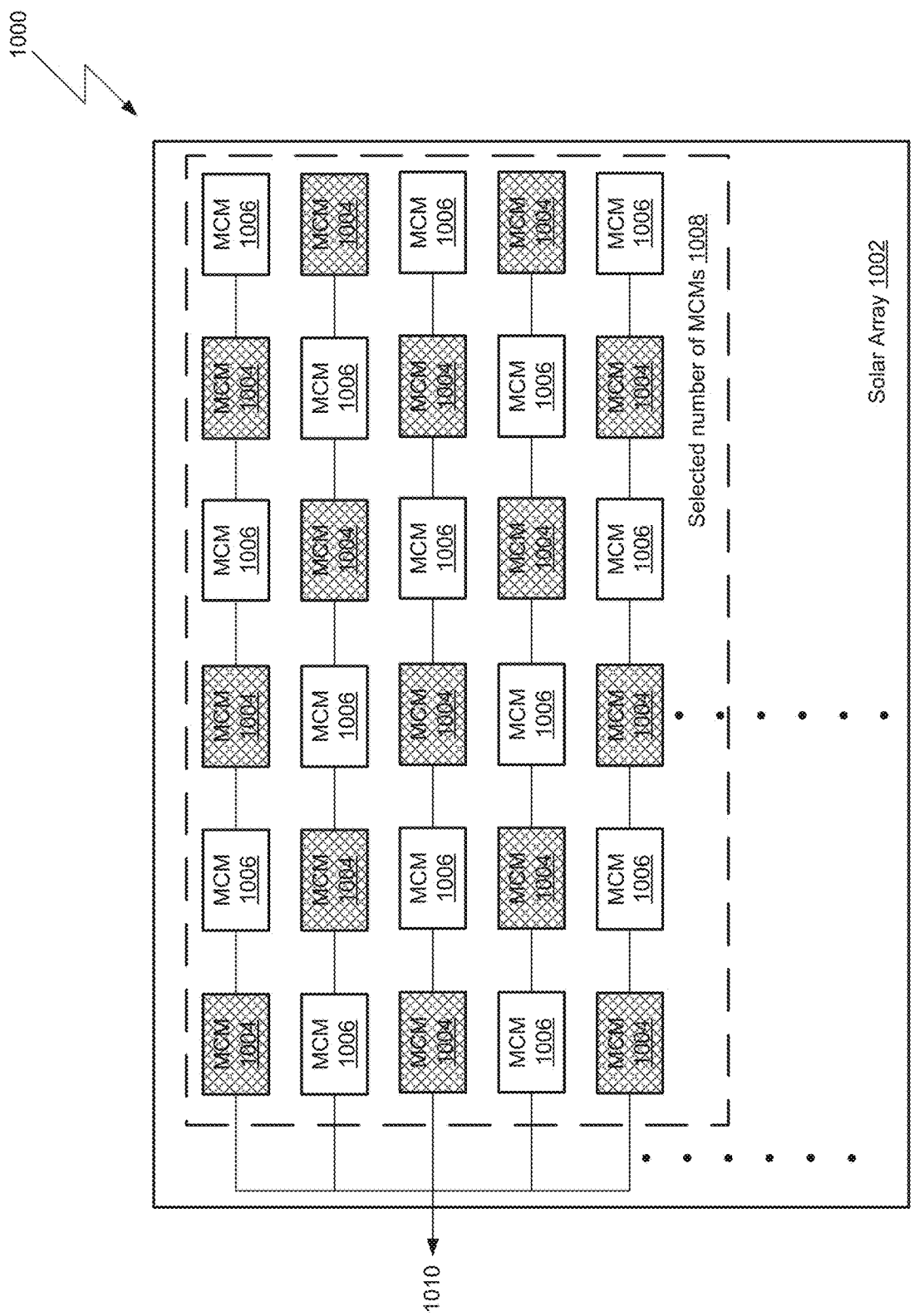
FIG. 10 is a block diagram of an example solar power supply illustrating another example of a method for energizing solar cells using the concentration ratio in accordance with the present disclosure.

FIG. 10 is a block diagram of an example space system 1000 for powering a spacecraft 100 using a solar array 1002. The solar array 1002 includes a plurality of micro-concentrator modules 1004 and 1006, each micro-concentrator module 1004 and 1006 configured as the MCMs 904a through 904i in FIG. 9. In the example shown in FIG. 10, the spacecraft 100 may determine the concentration ratio and select a number of MCMs 1008 corresponding to the concentration ratio, and then energize all of the reflector groups on the selected MCMs 1008 to orient into the solar cell energizing position. FIG. 10 shows the solar array 1002 with a first set of MCMs 1004 as grey boxes representing MCMs 1004 selected to generate the maximum power output capacity 1010 of the MCMs 1008. In the first set of MCMs 1004, each reflector group corresponding to each solar cell in each micro-concentrator array 908 (in FIG. 9) in each MCM 1004 is oriented to the solar cell energizing position, such as for example, the orientation of the reflectors 406 in FIG. 4A. A second set of MCMs 1006 shown as white boxes represent MCMs 1006 not selected to generate power. In the second set of MCMs 1006, each reflector group corresponding to each solar cell in each micro-concentrator array 908 (in FIG. 9) in each MCM 1006 is oriented to the solar cell non-energizing position (corresponding to the off-pointing position), such as for example, the orientation of the reflectors 406 in FIG. 4B.

Figure 11:
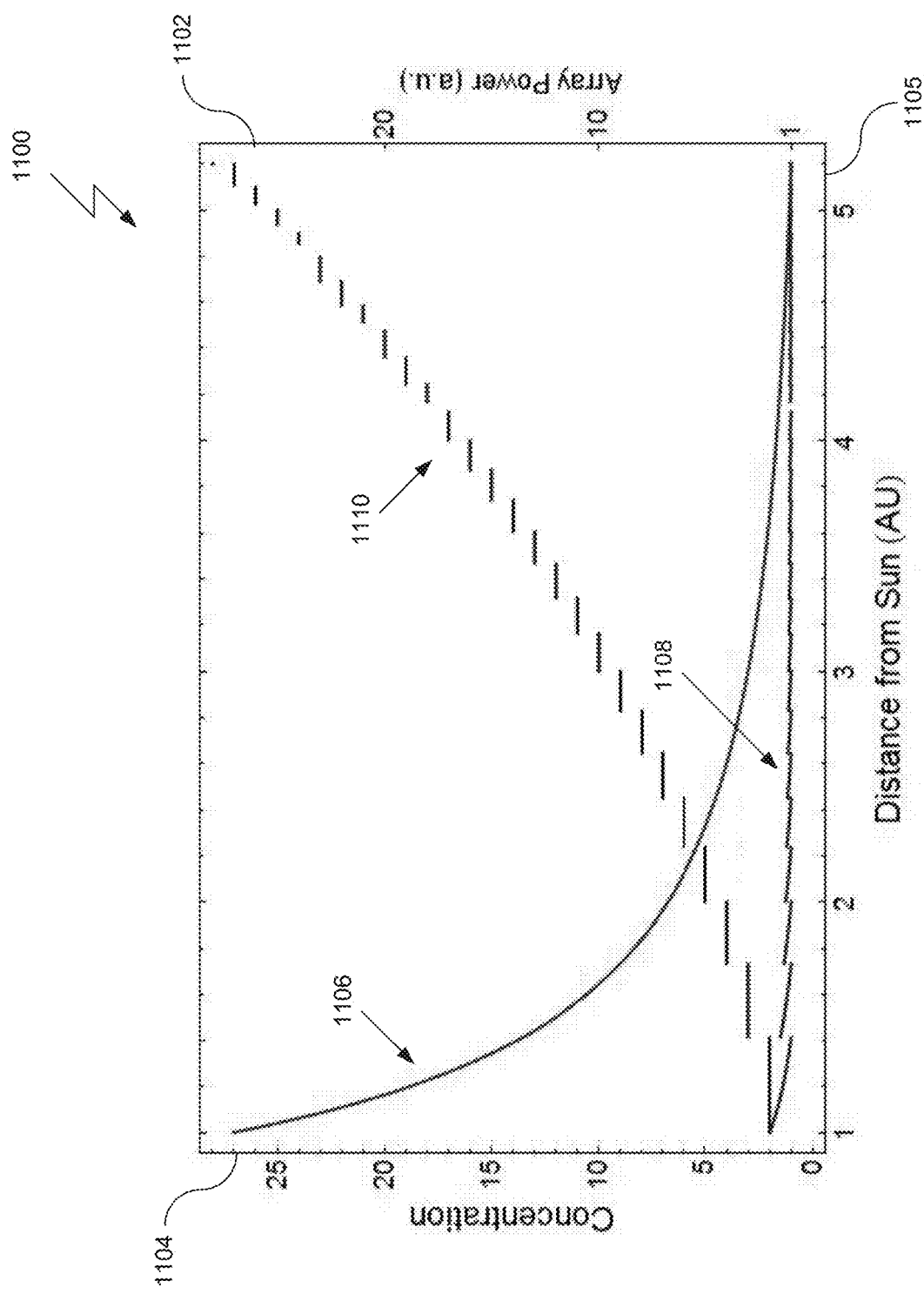
FIG. 11 is a graph illustrating a comparison of the power output from a solar power supply that varies the concentration ratio with the power output with a solar power supply that does not in accordance with the present disclosure.

FIG. 11 is a graph 1100 illustrating a comparison of the power output from an example implementation of the solar power supply 220 in FIG. 2B having solar concentrator modules 222a through 222i in which the solar concentration ratio is varied during the mission and the power output from a typical solar power supply having solar concentrator arrays that do not implement a varying concentration ratio. The graph 1100 in FIG. 11 has two vertical axes. The vertical axis 1102 on the right ("array power") represents a normalized power output, so that a value of 1 represents the spacecraft power requirement and a value of 20 represents 20× the spacecraft power requirement. The vertical axis on the left ("Concentration") 1104 represents the values of concentration ratio that may be used by the example implementation of the solar power supply 220 in FIG. 2B. The horizontal axis 1105 represents the distance from the Sun in AU.

The graph 1100 shows a first curve 1106 representing the power output of the typical solar power supply. The first curve 1106 uses the vertical axis on the right ("array power") to show the power output dropping as the distance to the Sun increases. The power output shown by the first curve 1106 drops from a power output at an AU of 1 (at Earth) that is about 25× the spacecraft power requirement to the power output of about 1 at Jupiter's 5 AU distance from the Sun. The drop in power output is due to the decreasing intensity of light as the spacecraft travels further away from the Sun.

FIG. 11 shows a second curve 1108 representing the power output of the example implementation of the solar power supply 220 in FIG. 2B, which varies the concentration ratio for the concentrator modules 222a through 222i. The second curve 1108 also uses the vertical axis on the right ("array power") to show the power output remaining substantially level during the course of the mission as the spacecraft travels away from the Sun.

FIG. 11 shows the relationship between the concentration ratio and the power output of the example implementation of the solar power supply 220 at a third curve 1110. The third curve 1110 uses the Concentration vertical axis 1104 and shows the increase of the concentration ratio as the spacecraft 100 travels away from the Sun to maintain the power output level as indicated by the second curve 1108. As described above, the low concentration ratio at the beginning of the mission results in a portion of reflectors within each MCM oriented in the solar cell energizing position and the remaining reflectors oriented in the solar cell non-energizing. The concentration ratio increases as the spacecraft travels away from the Sun as indicated by the third curve 1110. The increase in concentration ratio results in more and more reflectors oriented in the solar cell energizing position during the mission until all of the reflectors are in the solar cell energizing position at about 5 A.U. The power output remains substantially level through the course of the mission.

Example of implementations of systems and methods for controlling the power output of concentrator arrays using concentrators to focus light on photovoltaic cells to generate electrical energy. It is noted that individual reflectors in a reflector group may be oriented in the solar cell non-energizing position for functions not relating to the management of electrical power distribution. As discussed with relation to thermal management, the solar cell non-energizing position also corresponds to an off-pointing position to control the temperature of the solar cell. In addition, to thermal management, for example, a spacecraft 100 may be exposed to a sudden burst of light having energy sufficient to cause damage to the spacecraft. Such an exposure may be due to a laser attack by an entity intending to destroy or damage the spacecraft 100, or to a high-intensity burst of light from natural or other un-natural sources.

A sudden burst of destructive light energy may be detected by the spacecraft 100. For example, during the mission, the controller 228 may continuously monitor the available power output. While monitoring the available power output, the controller 228 may sense a spike or a sudden power surge not likely to be caused by light from the Sun incident on the solar concentrator array 224. The controller 228 may determine from the spike or sudden power surge that the spacecraft 100 is under an attack from a sudden burst of light energy sufficient to cause damage. In response, the solar concentrator array 224 may be controlled to orient a selected number of the reflector groups in the off-pointing position (i.e., the solar cell non-energizing position) to direct the laser light away from the spacecraft 100. Similar to the situation for thermal management, the selected number may be all of the reflector groups, which would shut electrical power to the spacecraft 100, or a number sufficient to reflect energy from the laser away from the spacecraft 100. This response could be programmed autonomously into the control programming or potentially commanded from the ground in advance of a known threat.

Figure 12:
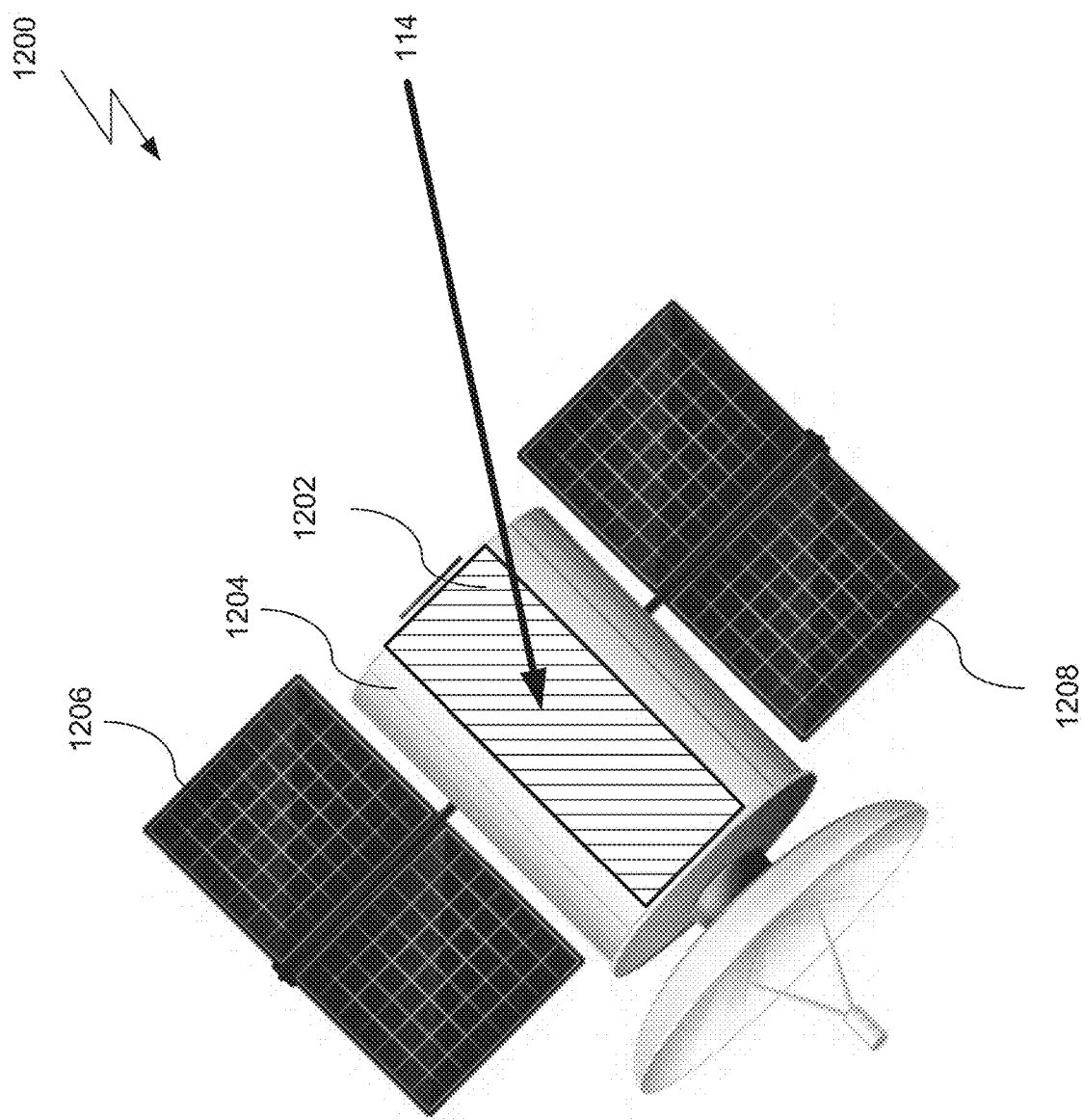
FIG. 12 is a perspective view of an example of another implementation of a spacecraft having a mirror section utilizing the TMS in accordance with the present disclosure.

Turning to FIG. 12, a perspective view of an example of another implementation of a spacecraft 1200 is shown in accordance with the present disclosure. In this example, the spacecraft 1200 includes a selective reflective panel that is a mirror having a mirrored section 1202 on the body 1204 of the spacecraft 1200 that utilize the TMS (not shown) to control the temperature of the body 1204 of spacecraft 1200 when the body 1204 of the spacecraft 1200 is impinged with sunlight 114. Furthermore, the spacecraft 1200 also includes two solar panels 1206 and 1208 that may also include a TMS (not shown) in each solar panel 1206 and 1208 as described earlier. If present, the TMS in each solar panel 1206 and 1208 may include a solar concentrator module as described earlier with regard to FIGS. 2A through 11. However, the TMS within the mirrored section 1202 will not include the same type of solar concentrator modules as described earlier. Instead, the TMS within the mirrored section 1202 will not utilize any solar cells (such as, for example, solar cell 402). The TMS may utilize a plurality of reflectors (not shown) to either "turn-off" or "turn-on" the mirrored section 1202 by positioning the reflectors into an off-pointing position to turn-on the mirrored section 1202 or positioning the reflectors into a non-off-pointing position to turn-off the mirrored section 1202.

Figure 13A:
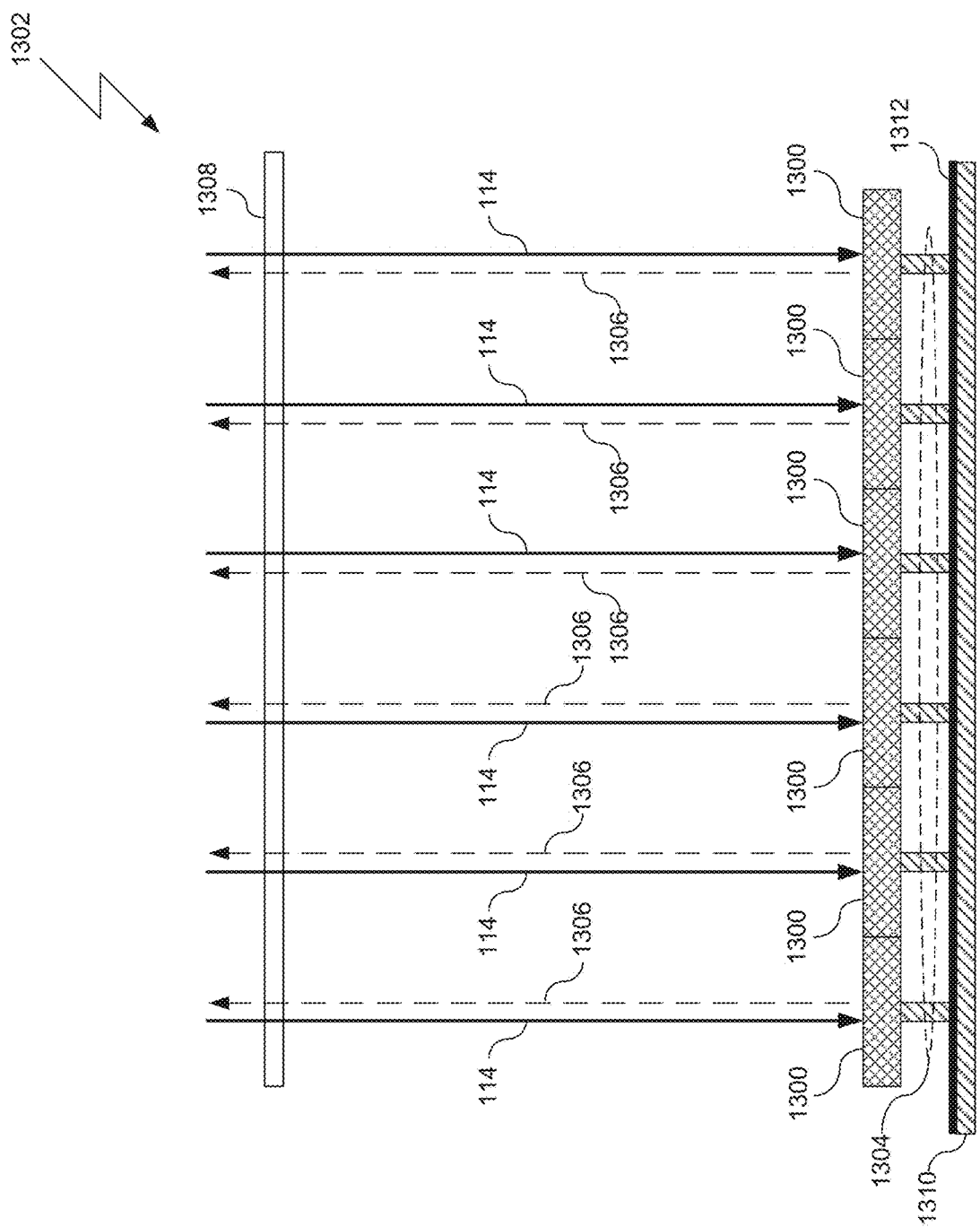
FIG. 13A is a cross-sectional view of an example of the mirror, shown in FIG. 12, and corresponding reflectors in the mirror in an off-pointing position in accordance with the present disclosure.

Specifically, in FIG. 13A, a cross-sectional view of an example of the mirror section 1202 (shown in FIG. 12) and corresponding reflectors 1300 in the mirror section 1202 in an off-pointing position is shown in accordance with the present disclosure. If the mirror section 1202 utilizes a solar concentrator array where the reflectors 1300 are reflector group units on the solar concentrator array, then this example is similar to the example of shown in FIGS. 4A through 4E except that in this example the mirror section 1202 does not include a solar cell (such as solar cell 402) because the mirror section 1202 is not a solar panel but simply a mirror configured to reflect off the sunlight 114 when the reflectors (not shown) are in the off-pointing position. By reflecting off the sunlight 114, the TMS reduces the amount of heat on the body 1204 of the spacecraft 1200.

In this example, the mirror section 1202 will be assumed to utilize a plurality of solar concentrator arrays (not shown) similar to the solar concentrator module 200 except that the plurality of solar concentrator arrays, in this example, will not have solar cells and will be utilized by the TMS to either absorb or reflect off sunlight 114.

Similar to the previous discussion, in this example, the TMS includes the one or more temperature sensors on the mirror section 1202, a controller (or controllers), and one or more solar concentrator arrays, where the controller is in signal communication with both the one or more temperature sensors and the one or more solar concentrator arrays. As discussed earlier, each solar concentrator array is configured to receive a control signal from the controller and, in response, position the selected number of reflectors into the off-pointing position to control the local temperature of the mirror section 1202 thereby controlling the temperature of the body 1204 of the spacecraft 1200.

As such, turning back to FIG. 13A, is a cross-sectional view of the mirror section 1202 and reflector group unit 1302 with the reflectors 1300 oriented in an off-pointing position that reflects off all of the impinging sunlight 114 on the reflector group unit 1302. Similar to the example shown in FIG. 2A, the solar concentrator module may also include a control module (not shown) where the control module is configured to send signals to the actuators 1304 to orient the reflectors 1300 to point the reflected sunlight 1306 in a direction away from the reflector group unit 1302. Again, the control module provides control and telemetry functions for the solar concentrator module. The control module may include processing resources such as a processor and storage capabilities to store data and instructions for performing programmed functions. The control module includes functions for controlling the position and orientation of the reflectors 1300. The control module may control a number of reflectors 1300 or of reflector groups to direct light away from reflector group unit 1302 and other reflector group units. The control module may also include a communications interface for receiving signals or commands from, for example, other computing components such as, for example, a flight computer on a spacecraft 1200. As described earlier, in this example, the control module may be the controller of the TMS or a device, module, or system that is in signal communication with the controller (or controllers) of the TMS.

When the reflectors 1300 direct the reflected sunlight 1306 so that the reflected sunlight 1306 does not get absorbed by the reflector group unit 1302, the reflector group unit 1302 and, correspondingly, the mirror section 1202 and body 1204 of the spacecraft 1200 does not increase in temperature because the energy from the sunlight 114 is reflected away from the spacecraft 1200. In this example, the reflectors 1300 are shown oriented perpendicularly to the incident angle of the sunlight 114 so as to direct the reflected sunlight 414 back along the angle of incidence of the sunlight 114. The off-pointing position may, however, be any position or orientation of the reflectors 1300 that allow the reflector 1300 to direct light in any direction that is away from the reflector group unit 1302 and the spacecraft 1200.

As such, the an off-pointing position of the reflectors 1300 assist in thermal management of the spacecraft 1200 because the reflected sunlight 414 is not absorbed by the reflector group unit 1302 and reflected back into outer space and away from the spacecraft 1200. As result, the off-pointing position reduces the local temperature of mirror section 1202 at the position of reflector group unit 1302 within the mirror section 1202.

In this example, similar to the examples described with regards to FIGS. 2A through 4E, the reflector group unit 1302 includes a first planar substrate 1308, preferably made of glass, plastic, silicon dioxide, or some other suitable transparent material (as described above with reference to FIG. 3A) and the plurality of reflectors 1300 mounted on a second planar substrate 1310 spaced apart from, and in parallel with, the first planar substrate 1308. The first and second substrates 1308 and 1310 are oriented so that sunlight 114 is incident to the reflector group unit 1302 at the first planar substrate 1308. While the sunlight 114 is shown in FIG. 13A directed to the first planar substrate 1308 at a substantially normal incident angle, the reflectors 1300 may be adjusted in position to reflect off the incident sunlight 114 when the angle of incidence of the sunlight 114 shifts away from normal. In this example, the sunlight 114 passes through the clear first planar substrate 1308 towards the reflectors 1300 in the reflector group unit 1302. The reflectors 1300 reflect and direct reflected sunlight light 1306 through the first planar substrate 1308 and away from the spacecraft 1200. Furthermore, in this example, the second substrate 1310 may be constructed of fused silica or other similar material. The second substrate 1310 may be configured to increase in temperature when impinged with incident sunlight 114 or the reflector group unit 1302 may include an energy absorbing material layer 1312 that is located adjacent to and on top of the surface of the second substrate 1310.

Figure 13B:
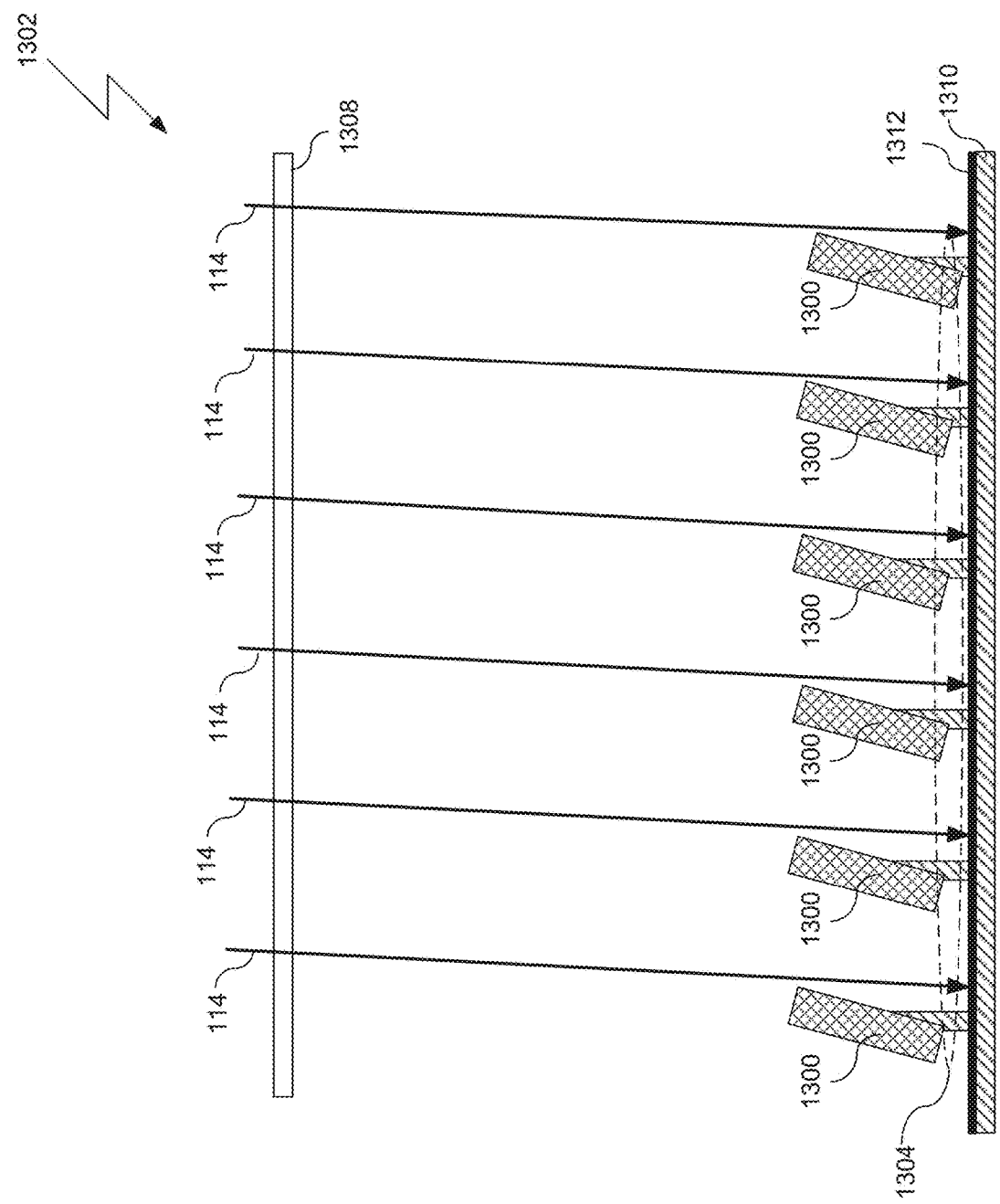
FIG. 13B is a cross-sectional view of an example of the mirror, shown in FIG. 12, and corresponding reflectors in a non-off-pointing position in accordance with the present disclosure.

In FIG. 13B, a cross-sectional view of an example of the reflector group unit 1302 and corresponding reflectors 1300 is shown in a non-off-pointing position in accordance with the present disclosure. Similar to the example shown in FIG. 13A, in this example, the control module may send signals to the actuators 1304 to orient the reflectors 1300 to point in a direction away from the sunlight 114 so that the sunlight is not reflected away from the reflector group unit 1302 by the reflects 1300 and, instead, impinges on the either the energy absorbing material layer 1312 or the second substrate 1310. In this fashion, the energy absorbing material layer 1312, the second substrate 1310, or both absorb part or most of the energy from impinging sunlight 114 and produce heat at the reflector group unit 1302 which increases the local temperature of the mirror section 1202 close to the location of the reflector group unit 1302. As a result, by utilizing the reflectors 1300 in the reflector group unit 1302, the TMS may manage the local temperature of the mirror section 1202 by moving the reflectors in either an off-pointing position (i.e., a sunlight 114 reflecting position) or a non-off-pointing position (i.e., a sunlight 114 absorbing position).

Figure 14:
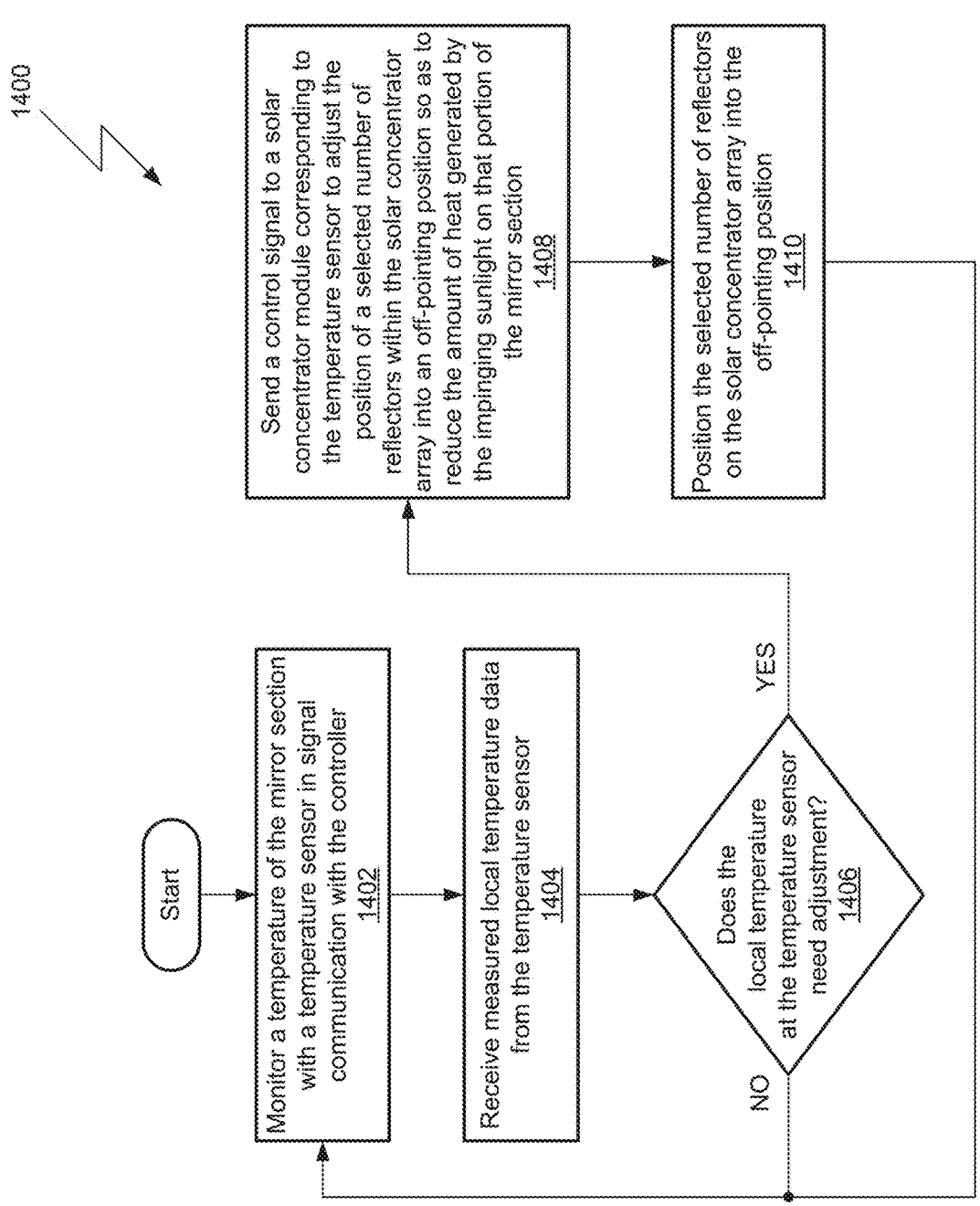
FIG. 14 is a flowchart illustrating an example of operation of a method for controlling a temperature of the spacecraft, shown in FIG. 12, with the TMS in accordance with the present disclosure.

Turning to FIG. 14, a flowchart 1400 illustrating an example of operation of a method for controlling a temperature of the spacecraft 1200 with the TMS is shown in accordance with the present disclosure. In this example, the selective reflective panel is the mirror section 1202 (of FIGS. 12 through 13B).

The method includes monitoring 1402 a first local temperature of the selectively reflective panel (i.e., mirror section 1202) with a first temperature sensor in signal communication with a controller and receiving 1404 a first control signal from the controller to position a first selected number of reflectors on the solar concentrator array into an off-pointing position in response to the received first control signal that corresponds to the monitored first local temperature, wherein the first selected number of reflectors is determined to control the first local temperature of the selectively reflective panel. The TMS then determines 1406 (from the received first temperature data from the first temperature sensor at the controller) if the local temperature at the temperature sensor needs adjustment. If the local temperature at the temperature sensor does not need adjustment, the method returns to step 1402 and the method repeats steps 1402 through 1406.

If, instead, the local temperature at the temperature sensor does need adjustment, the TMS determines the first selected number of reflectors on the solar concentrator array to be placed into the off-pointing position in response to the first temperature data at the controller and produces the first control signal, at the controller, in response to determining the first selected number of reflectors to be placed into the off-pointing position. The control signal is then sent 1408 to the solar concentrator module corresponding to the temperature sensor to adjust the position of a selected number of reflectors within the solar concentrator array into an off-pointing position so as to reduce the amount of heat generated by the impinging sunlight 114 on that portion of the mirror section 1202. In response, the solar concentrator array positions 1410 the first selected number of reflectors into the off-pointing position to control the first local temperature of the selectively reflective panel thereby controlling the temperature of the selectively reflective panel. The method then returns to step 1402 where the steps 1402 through 1410 are repeated.

In this example, the step of positioning the first selected number of reflectors into the off-pointing position may include positioning the first selected number of reflectors into a partial off-pointing position or a full off-pointing position. Additionally, the step of positioning the first selected number of reflectors into the off-pointing position may include adjusting the position and angle of each reflector of first selected number of reflectors with a plurality of actuators within a first microconcentrator module ("MCM"). Furthermore, the step of receiving the first control signal from the controller may include receiving the first control signal at a first control module, and the step of positioning the first selected number of reflectors into the off-pointing position may include positioning the first selected number of reflectors in the solar concentrator array into the off-pointing position with the first control module in response to receiving the first control signal. Moreover, the method may also include: monitoring a second local temperature of the selectively reflective panel with a second temperature sensor in signal communication with the controller; receiving a second control signal from the controller to position a second selected number of reflectors on a second solar concentrator array into an off-pointing position in response to the received second control signal that corresponds to the monitored second local temperature, wherein the second selected number of reflectors is determined to control the second local temperature of the selectively reflective panel; and positioning the second selected number of reflectors into the off-pointing position to control the second local temperature of the selectively reflective panel. Still further, the method may also include: receiving a second temperature data from the second temperature sensor at the controller; determining the second selected number of reflectors on the second solar concentrator array to be placed into the off-pointing position in response to the second temperature data at the controller; and producing the second control signal, at the controller, in response to determining the second selected number of reflectors to be placed into the off-pointing position. Receiving the second control signal from the controller may include receiving the second control signal at a second control module and positioning the second selected number of reflectors into the off-pointing position may include positioning the second selected number of reflectors in the solar concentrator array into the off-pointing position with the second control module in response to receiving the second control signal.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure.

The flowcharts and block diagrams in the different depicted examples illustrate the architecture, functionality, and operation of some possible implementations of apparatuses and methods in an illustrative example. In this regard, each block in the flowcharts or block diagrams may represent a module, a segment, a function, a portion of an operation or step, some combination thereof.

In some alternative implementations of an illustrative example, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different illustrative examples has been presented for purposes of illustration and description, and is not intended to be exhaustive or limited to the examples in the form disclosed. Many modifications and variations will be apparent to those of ordinary skill in the art. Further, different illustrative examples may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

What is claimed is:

1. A thermal management system ("TMS") for controlling a temperature of a reflective panel of a spacecraft, the TMS comprising:
    a first solar concentrator array having reflectors arranged in reflector groups, wherein the first solar concentrator array is located within the reflective panel, and wherein the reflector groups include a first reflector group having a plurality of individually controllable reflectors each moveable between a first position to reflect light in a first direction and a second position to reflect the light in a second direction, wherein the light reflected in the first direction causes a first amount of energy to be absorbed by a first solar cell, and wherein the light reflected in the second direction causes a second amount of energy to be absorbed by the first solar cell, the first amount of energy greater than the second amount of energy;
    a first temperature sensor proximate to the reflective panel, the first temperature sensor configured to generate first sensor data indicative of temperature associated with the reflective panel; and
    a controller in signal communication with the first temperature sensor and the first solar concentrator array, the controller is configured to:
        identify a first set of the plurality of individually controllable reflectors to orient in the first position;
        receive first sensor data from the first temperature sensor;
        determine a first temperature associated with the reflective panel based on the first sensor data;
        in response to determining that the first temperature exceeds a threshold temperature value, determine a subset of the first set of the plurality of individually controllable reflectors to move from the first position to the second position; and
        send a first control signal to cause the subset of the first set of the plurality of individually controllable reflectors to move to the second position to cause a change in temperature of the reflective panel, wherein a second subset of the first set of the plurality of individually controllable reflectors remain in the first position.

2. The TMS of claim 1, wherein the controller includes a processor, wherein the controller is further configured to monitor the temperature of the reflective panel based on the first sensor data, and wherein the light reflected in the second direction is reflected at least partially away from the reflective panel.

3. The TMS of claim 1, wherein the light reflected in the second direction is reflected partially away or substantially away from the reflective panel.

4. The TMS of claim 1, wherein the first solar concentrator array includes a micro-electro-mechanical system ("MEM") concentrator and wherein the reflective panel comprises a mirror.

5. The TMS of claim 1, wherein at least plurality of individual controllable reflectors is configured to translate in a direction substantially perpendicular to a substrate of the reflective panel when moving from the first position to the second position.

6. The TMS of claim 1, further comprising a solar concentrator module including the first solar concentrator array and a first control module, wherein the first control module is in signal communication with both the first solar concentrator array and the controller, wherein the first control module is configured to cause the one or more of the plurality of individually controllable reflectors to be oriented between the first position and the second position in response to receiving one or more signals from the controller, wherein the first solar concentrator array includes a plurality of photovoltaic cells, and wherein each of the plurality of the individually controllable reflectors is configured to selectively reflect light onto a surface of one or more of the plurality of photovoltaic cells.

7. The TMS of claim 6, wherein the solar concentrator module comprises a microconcentrator module ("MCM").

8. The TMS of claim 1, further comprising a solar concentrator module including the first solar concentrator array and a first control module, wherein identifying the first set of the plurality of individually controllable reflectors to orient in the first position is based on a concentration ratio of a power level, wherein the first control module is configured to send a first control module signal to cause the first set of the plurality of individually controllable reflectors to be oriented in the first position in response to receiving one or more signals from the controller, and wherein the light reflected in the first direction is reflected onto a photovoltaic cell of the reflective panel.

9. The TMS of claim 1, further comprising:
a second solar concentrator module including the first solar concentrator array;
a second solar concentrator array having a plurality of photovoltaic cells and reflectors arranged in second reflector groups corresponding to the plurality of photovoltaic cells, wherein the second solar concentrator array is located within the reflective panel, and wherein the second reflector groups include a second reflector group having a second plurality of individually controllable reflectors; and
a second temperature sensor located within the reflective panel, the second temperature sensor configured to generate second sensor data indicative of temperature, wherein the controller is further configured to generate a second control signal to cause corresponding positions of each of the plurality of individually controllable reflector to be adjusted based on the second sensor data.

10. The TMS of claim 9, wherein the second solar concentrator module comprises a second MCM.

11. The TMS of claim 10, wherein the reflective panel comprises a solar panel.

12. A method for controlling a temperature of a reflective panel having a solar concentrator array with a thermal management system ("TMS"), the solar concentrator array having reflectors arranged in reflector groups, the reflector groups including a first reflector group having a plurality of individually controllable reflectors, and each of the plurality of individually controllable reflectors is movable between a first position to reflect light in a first direction and a second position to reflect the light in a second direction, wherein the light reflected in the first direction causes a first amount of energy to be absorbed by a solar cell, and wherein the light reflected in the second direction causes a second amount of energy to be absorbed by the cell, the first amount of energy greater than the second amount of energy, the method comprising:

identifying a first set of the plurality of individually controllable reflectors to orient in the first position;
monitoring a first temperature of the reflective panel with a first temperature sensor in signal communication with a controller, the first temperature sensor proximate to the reflective panel;
in response to determining that the first temperature exceeds a threshold temperature value, determining a subset of the first set of the plurality of individually controllable reflectors to move from the first position to the second position; and
moving the subset of the first set of the plurality of individually controllable reflectors to the second position to cause a change in temperature of the reflective panel wherein a second subset of the first set of the plurality of individually controllable reflectors remain in the first position.

13. The method of claim 12, wherein the light reflected in the second direction is at least partially reflected away from the reflective panel.

14. The method of claim 13, wherein moving the subset of the first set of the plurality of individually controllable reflectors to the second position includes adjusting the position and angle of each reflector of the subset within a first microconcentrator module ("MCM").

15. The method of claim 13, further including receiving first temperature data from the first temperature sensor at the controller.

16. The method of claim 15, further comprising receiving a first control signal at a first control module.

17. The method of claim 16, further including
monitoring a second temperature of the reflective panel with a second temperature sensor in signal communication with the controller,
in response to determining that the second temperature exceeds a second threshold temperature value, determining a third subset of the first set of the plurality of individually controllable reflectors to move from the first position to the second position; and
moving the third subset of the first set of the plurality of individually controllable reflectors to the second position to cause a change in the temperature of the reflective panel.

18. The method of claim 17, further including receiving second temperature data from the second temperature sensor at the controller, and generating a second control signal, at the controller, in response to determining that the third subset of the first set of the plurality of individually controllable reflectors is to move from the first position to the second position, wherein the second control signal is received at a second control module, and wherein the third subset of the first set of the plurality of individually controllable reflectors are moved to the second position in response to receiving the second control signal at the second control module.

19. The method of claim 18, wherein the reflective panel is a solar panel and wherein the solar concentrator array includes a plurality of photovoltaic cells and the plurality of individually controllable reflectors are arranged in the reflector groups corresponding to the plurality of photovoltaic cells.

20. The method of claim 18, further including reflecting an impinging sunlight away from the reflective panel when one or more of the plurality of individually controllable reflectors is oriented in the second position.

* * * * *

UNITED STATES PATENT AND TRADEMARK OFFICE
CERTIFICATE OF CORRECTION

PATENT NO. : 10,930,806 B2
APPLICATION NO. : 15/369216
DATED : February 23, 2021
INVENTOR(S) : Marc Louis Breen, Scott B. Singer and John W. Behrens Page 1 of 1

It is certified that error appears in the above-identified patent and that said Letters Patent is hereby corrected as shown below:

In the Claims

Claim 5, Column 30, Line 63, change:
"wherein at least plurality of"

To read:
--wherein at least one of the plurality of--

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*